(12) United States Patent
Sheperek et al.

(10) Patent No.: US 10,748,625 B1
(45) Date of Patent: Aug. 18, 2020

(54) DYNAMIC PROGRAMING OF VALLEY MARGINS OF A MEMORY CELL

(71) Applicant: Micron Technology, Inc., Boise, ID (US)

(72) Inventors: Michael Sheperek, Longmont, CO (US); Larry J. Koudele, Erie, CO (US); Bruce A. Liikanen, Berthoud, CO (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/295,857

(22) Filed: Mar. 7, 2019

(51) Int. Cl.
*G11C 16/10* (2006.01)
*G11C 16/34* (2006.01)
*G11C 5/04* (2006.01)
*G11C 11/56* (2006.01)

(52) U.S. Cl.
CPC ............ *G11C 16/3404* (2013.01); *G11C 5/04* (2013.01); *G11C 11/5628* (2013.01); *G11C 11/5642* (2013.01); *G11C 16/3459* (2013.01); *G11C 2211/5623* (2013.01); *G11C 2211/5624* (2013.01); *G11C 2211/5625* (2013.01)

(58) Field of Classification Search
CPC ... G11C 16/3404; G11C 16/3459; G11C 5/04; G11C 11/5642; G11C 11/5628; G11C 2211/5625; G11C 2211/5623; G11C 2211/5624
See application file for complete search history.

(56) References Cited

U.S. PATENT DOCUMENTS

| 8,862,969 | B2 | 10/2014 | Liikanen et al. | |
| 9,142,272 | B2* | 9/2015 | Van Huben | G11C 7/225 |
| 9,318,171 | B2* | 4/2016 | Van Huben | G11C 7/225 |
| 2018/0341415 | A1* | 11/2018 | Koudele | G11C 16/3459 |
| 2018/0341416 | A1* | 11/2018 | Koudele | G11C 16/3459 |
| 2018/0341552 | A1* | 11/2018 | Liikanen | G11C 16/10 |
| 2018/0341553 | A1* | 11/2018 | Koudele | G11C 29/021 |

* cited by examiner

*Primary Examiner* — Gene N Auduong
(74) *Attorney, Agent, or Firm* — Lowenstein Sandler LLP

(57) ABSTRACT

A processing device determines difference error counts for a difference error that is indicative of a margin for a valley that is located between programming distributions of a memory cell of the memory component. A processing device scales each of the plurality of difference error counts by a respective scale factor of the scale factors. The processing device adjusts the valley margins of the memory cell in accordance with the scaled difference error counts.

20 Claims, 12 Drawing Sheets

US 10,748,625 B1

DYNAMIC PROGRAMMING OF VALLEY MARGINS OF A MEMORY CELL

TECHNICAL FIELD

Embodiments of the disclosure relate generally to memory sub-systems, and more specifically, relate to programming operations on memory cells of the memory sub-systems to program valley margins.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure.

DETAILED DESCRIPTION

Figure 1:
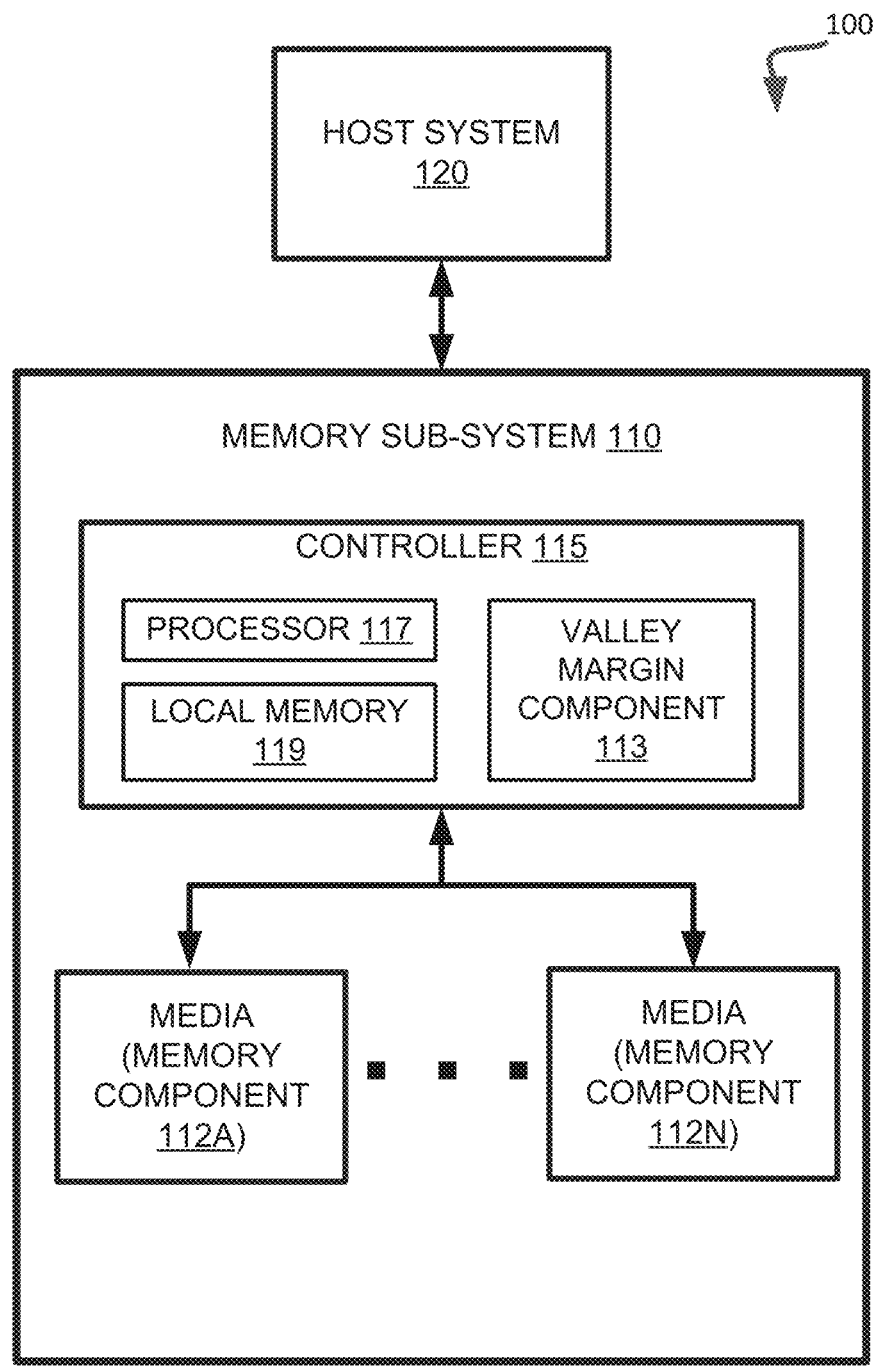
FIG. 1 illustrates an example computing environment that includes a memory sub-system 110 in accordance with some embodiments of the disclosure.

Aspects of the present disclosure are directed to the programming of valley margins of memory cells of a memory sub-system. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

A single-level cell (SLC) can store only one bit per memory element, whereas a multi-level cell (MLC) is a memory element that is capable of storing more than a single bit of information. It should be noted that the state of the memory cell can be programmed and the state of the memory can be determined by comparing a read voltage of the memory cell against one or more read level thresholds. That is, with SLC NAND flash technology, each cell can exist in one of two states, storing one bit of information per cell, whereas MLC NAND flash memory has four or more possible states per cell, so each MLC-based cell can store two or more bits of information per cell. The higher number of possible states reduces the amount of margin (e.g., valley margin) separating the states. The memory device can include triple-level cell (TLC) memory. In TLC memory, the memory cell stores three bits of information per cell with eight total voltage states. The memory device can include a quad-level cell (QLC) memory. In QLC memory, each memory cell can store four bits of information with sixteen voltage states. For example, in a QLC memory, a memory cell can store four bits of data (e.g., 1111, 0000, 1101, etc.) corresponding to data received from the host system using the sixteen voltage states. It can be noted that operations herein can be applied to any multi-bit memory cells.

Each bit of the memory cell is stored at a different portion (also referred to as "logical page" hereafter) of the memory cell. Various read level thresholds can be used for the various logical page types (also referred to as "page types" herein): SLC page types are lower logical pages (LPs), MLC page types are LPs and upper logical pages (UPs), TLC page types are LPs, UPs, and extra logical pages (XPs), and QLC page types are LPs, UPs, XPs and top logical pages (TPs). For example, a memory cell of the QLC memory can have a total of four logical pages, including a lower logical page (LP), an upper logical page (UP), an extra logical page (XP) and a top logical page (TP), where each logical page stores a bit of data. For example, a bit can be represented by each of the four logical pages of the memory cell. In a memory cell for QLC memory, each combination of four bits can correspond to a different voltage level (also referred to as "level" hereafter). For example, a first level of the memory cell can correspond to 1111, a second level can correspond to 0111, and so on. Because a memory cell for a QLC memory includes 4 bits of data, there are a total of 16 possible combinations of the four bits of data. Accordingly, a memory cell for a QLC memory can be programmed to one of 16 different levels.

In embodiments, the memory system receives a request from a host system to perform a programming operation to store data at the QLC memory (or other memory components having memory cells that store two or more bits). A controller of the memory system can store the data by performing multi-pass programming (e.g., two or more programming passes) that programs or stores data at the memory cell. A first programming pass can program data at the memory cell at a particular time. At a later time, a second programming pass can be performed on the memory cell to store additional data at the memory cell. The second programming pass uses the information stored in the first programming pass. A certain amount of time can elapse between the memory sub-system performing the first programming pass and performing the second programming pass on the same memory cell. During a first programming pass of a two-pass programming operation, one or more voltage levels can be applied to the memory cell to program a first set of bits (e.g., 3 bits in 3 logical pages). During a second programming pass of the two-pass programming operation, one or more voltage levels can be applied to the memory cell to program an additional bit to the first set of bits (e.g., 4 bits in 4 logical pages). The level that the memory cell is programmed to in the second programming pass can be based on the last logical page of the memory cell as well as the prior logical pages that were programmed at the memory cell in the first programming pass.

A continuous read level calibration (cRLC) operation continuously samples valley margins between programming distributions. The valley margin can refer to a relative width or relative margin between pairs of adjacent programming distributions. For example, valley margins associated with a particular logical page type can indicate the relative width between pairs of programming distributions associated with the particular logical page type. For instance, a first valley margin of an upper logical page (e.g., valley 2 that is between the $2^{nd}$ distribution (L1) and $3^{rd}$ distribution (L2)) that is larger than a second valley margin of the upper logical page (e.g., valley 6 that is between the $6^{th}$ distribution (L5) and the $7^{th}$ distribution (L6)) can indicate that the first valley is larger than the second valley (e.g., valley 2 is large than valley 3), but does not explicitly recite the absolute width or size of either valley. Valley margin can be correlated with read window budget (RWB). Read window budget can refer to an absolute measurement in volts (e.g., millivolts (mV)) between two adjacent programming distributions. For example, the RWB for valley 2 can be 270 mV and the RWB for valley 6 can be 250 mV. If, for example, the first valley margin is larger than the second valley margin, then a correlation that the RWB of the first valley margin is larger than the RWB of the second valley margin can be made. A difference error count (Diff-EC) is a metric derived from measurements taken at a valley between two adjacent programming distributions that is indicative of the valley's relative width or margin. A first-pass cRLC can be performed during or after a first pass programming operation.

It can be noted that in some implementations, a first-pass cRLC is an optional operation. A second pass cRLC can be performed during or after a second pass programming operation. The cRLC operation measures and collects information about the valley margins, such as the center bit error count (CenterBEC) and the difference error count (Diff-EC) measurements.

The cRLC operation is a read level calibration that can be done for each of the multiple read level threshold registers used during all read operations. The cRLC operation can be performed to keep each read level threshold centered so that the memory component can achieve the best overall bit error rate (BER) possible. The cRLC operation is referred to as continuous because the operation samples continually and dynamically at discrete intervals. For example, a sample, which can be a set of three reads, can be made at about 1 sample operation in every 1 to 30 seconds, depending on the requirements. Each sample initiated by the cRLC operation returns data for a particular die and a particular logical page type so that over many of these operations the information is aggregated and fed back in a closed loop system such that each die or read level threshold is kept calibrated (e.g., the read level threshold is centered). In one implementation, a sample is three reads from the same read threshold valley (e.g., also referred to as "valley" or "Vt distribution valley" herein). The read level thresholds of the memory component can start with manufacturing default read level thresholds. The cRLC operation can be run during a test mode so that all read level offset trims of all word line groups (WLGs) of all dies in the memory system are calibrated (also referred to as "converged" herein). A memory cell (or WLG or memory component, etc.) that is calibrated or converged by cRLC has a center value that corresponds to a read level threshold (or read level trim) that is centered in or at a lowest point in the read threshold valley. A memory cell (or WLG or memory component, etc.) that is calibrated or converged by cRLC has a center value that results in a lowest bit error rate (BER). BER can refer to a ratio of a number of bits in error of a data vector divided by a total number of bits for the given data vector. A trim can refer to digital value that is used for a circuit, such as a register, that is converted into an analog voltage value. For example, the read threshold trims can be programmed into a trim register, which produces a read threshold voltage used to read data from a memory cell. The cRLC measurements can also be used for various types of Dynamic Program Targeting (DPT) operations.

A DPT operation controls the program verify (PV) target placement such that the programming distributions are placed in a beneficial arrangement. A PV target can refer to voltage value or trim value used to program a memory cell at a given level. The PV target can set a threshold voltage (Vt) (e.g., minimum voltage at which a memory cell turns on or is conductive) of the memory cell. A PV target is associated with a particular programming distribution. For example, multiple memory cells that are programmed at a particular PV target can have threshold voltages that are within the corresponding program distribution. The program distribution can illustrate the range of threshold voltages for memory cells programmed at a particular PV target. The DPT operation is a PV targeting calibration that can be done for each PV target. The DPT operation can be considered as a set of one or more operations to adjust or calibrate the placement of PV targets. The DPT operation calibrates (also referred to as "balances" herein) multiple logical page types such that the BER of each logical page type will be approximately the same through the life of the memory system and through all operating environments (e.g., minimizes BER sigma).

For example, the DPT operation can adjust the three TLC logical page types: Lower logical page (LP), upper logical page (UP), and Extra logical page (XP) such that the BER of each of these three logical page types will be approximately the same (i.e., balanced). The DPT operation uses the cRLC as the feedback metric in a closed loop feedback system. The DPT operation, in addition to balancing logical page type BER, keeps the BER of each logical page type balanced dynamically by performing the DPT operation during block programming, such as between the first programming pass and the second programming pass of a multi-pass programming operation on a block. Balancing the BER can reduce the average trigger rate throughout the life of each die, including end-of-life (EOL) conditions. By adjusting PV targets, DPT effectively moves the program distributions in the direction of the adjusted PV targets. DPT balancing or calibration (e.g., adjusting the PV targets) can result in valley margins of a particular logical page type to converge at a particular convergence value so that the valley margins for a particular page type are roughly the same. DPT calibration or convergence can include balancing the BER of each logical page type so that each valley associated with a particular logical page has roughly similar BER.

The DPT operation can increase endurance (i.e., more total Program/Erase cycles) for each die in a memory system. Using the DPT operation, no one logical page type will dominate the end of life criteria. The DPT operation can be performed independently for each word line group. The PV targets of the memory component can start with manufacturing default PV targets. The DPT operation can be run during a test mode so that all PV targets of all word line groups (WLGs) of all dies in the memory system have been balanced (i.e., when the BERs of the logical page types are approximately the same). In the test mode, the cRLC and DPT operations can run at an accelerated rate for a short period of time in the factory so that each WLG will have optimized and converged the cRLC read thresholds prior to deployment. The cRLC and DPT operations can be performed in an interleaved or concurrent method so that the memory system is continually maintained at its optimum and controlled valley margin through the life of the memory.

In operational mode (e.g., when in operation in the field), the cRLC and DPT operations can be run dynamically to extend the usable lifetime of the memory component. The term "dynamic" as used herein can refer to processes, functions, operations, or implementations that occur during operation, usage, or deployment of a corresponding device, system, or embodiment, and after or while running the manufacturer's or third-party firmware. The dynamically occurring processes, functions, operations, or implementations can occur after or subsequent to design, manufacture, and initial testing, setup or configuration (e.g., after test mode).

In some conventional memory sub-systems, the valley margins between pairs of adjacent programming distributions of a multi-bit memory cell cannot be adjusted. In other conventional memory sub-systems, the valley margins can be adjusted but cannot be adjusted independently. The valley margins are adjusted so that all the valley margins associated with at least a particular logical page type are the same.

Being able to control valley margins independently for valleys within a logical page type or even across logical page types can be advantageous. For example, being able to manage and adjust valley margins can help account for phenomenon such as quick charge gain, disturb mechanisms, and retention loss mechanisms. For instance, adjusting the width of a particular valley to be wider than one or more other valleys can address retention loss. In a multi-bit memory cell, the programming distributions with a higher voltage (e.g., programming distribution L7 of a TLC memory cell) tend to change over time (e.g. shift downward) more than programming distributions with lower voltages. Such changes can cause read errors and an increase in the error rate. If the valley margins between the programming distributions of higher voltages are programmed to be wider than the valley margins between programming distributions of lower voltages for a particular logical page type, the independent programming of valley margins can help address such challenges as retention loss.

Aspects of the disclosure address the above challenges by performing adjustments to valley margins independently so that valley margins associated with one or more logical page types can be dynamically adjusted to be different from one another (or even the same as one another).

In some embodiments, values of a metric that are indicative of the width between adjacent pairs of programming distributions are determined. For example, the metric can be a difference error, and the values can be difference error counts obtained from a cRLC operation. One more of the values of the metric can be scaled by a respective scale factor of a set of scale factors. The width between adjacent pairs of programming distributions of the memory cell can be adjusted in accordance with the scaled values. The scaled values can be passed to a DPT operation that uses the scaled values to independently adjust the valley margins.

For example, a cRLC operation can be performed after a second pass programming. The cRLC operation can calibrate read level thresholds and sample the Diff-ECs associated with the valleys between the programming distributions of the second pass programming. As noted above, the Diff-EC is a metric derived from measurements taken at a valley between two adjacent programming distributions that is indicative of the valley's relative width or margin. For example, two valleys with the same Diff-EC have valley widths that are approximately the same. The difference error (or difference error count) can be inversely proportional to the valley margins. The Diff-ECs can be passed to the DPT operation, where the DPT operation converges the Diff-ECs (non-scaled Diff-ECs or scaled Diff-ECs) for at least a particular logical page type to a convergence value. In so doing, the Diff-ECs for at least the particular logical page type are made to be very close in value. Since Diff-EC corresponds to the valley margin, converging the Diff-ECs to a particular convergence value also makes the valley margins for the particular logical page type approximately the same width.

The characteristic of DPT that converges the Diff-ECs to a particular convergence value can be used to independently adjust valley margins by using scale factors. Instead of using the raw Diff-ECs from the cRLC in the DPT operation, the Diff-ECs from the cRLC operation can be scaled before being used in the DPT operation. For instance, for a TLC memory cell the scale factors for the seven Diff-ECs of the seven valleys can be from the set of scale factors, such as [1.0, 1.0, 1.0, 1.0, 1.0, 1.0, 1.0, 2.0]. The first six scale factors (1.0) are associated with the Diff-ECs of valley V1-V6 respectively, and the last scale factor (2.0) is associated with the Diff-EC of valley V7. If for example, the cRLC returns a raw Diff-EC for all valleys 1-7 of 60 counts, scaling the Diff-ECs by the above scale factors result in the scaled Diff-ECs for valleys 1-6 of 60 counts (e.g., scale factor of 1.0, so the Diff-ECs do not change) and the scaled Diff-EC for valley 7 of 120 counts (e.g., scale factor of 2.0).

The scaled Diff-ECs can be passed to the DPT operation. The DPT operation calibrates the memory cell by adjusting one or more PV targets. The DPT calibration converges the scaled Diff-ECs for at least a particular logical page type to a convergence value. For a TLC memory cell, DPT calibration can converge the scaled Diff-EC measurements for valleys 3, 5, and 7 of the extra logical page (XP) to a convergence value (e.g., Diff-EC of approximately 60) so that each valley associated with the extra logical page has roughly similar BERs. It can be noted that in some embodiments, that a particular programming distribution can be fixed (e.g., programming distribution L0), and the Diff-EC of the valley (e.g., valley 1) associated with the particular fixed programming distribution is not calibrated to a convergence value.

DPT calibration moves the appropriate PV targets so that the Diff-ECs of valleys 3, 5, and 7 of the extra logical page (XP) converge to a convergence value (e.g., Diff-EC of approximately 60). The PV targets associated with valleys 3 and 5 do not move since the scaled Diff-ECs of valley 3 and 5 are already at the convergence value. One or more of the PV targets associated with valley 7 are adjusted so that the scaled Diff-EC of 120 counts is converged to convergence value of 60 counts. After DPT calibration, the converged and scaled Diff-EC of 60 counts for valley 7 is actually an un-scaled value of 30 counts (e.g., divided by the 2.0 scale factor). The unscaled Diff-EC of valley 7 of 30 counts is half of the Diff-ECs of valleys 1-6 (e.g., 60 counts). Since Diff-EC is inversely proportional to valley margin and valley margin is a relative measurement, the valley margin of valley 7 is approximately 2× the width of the valley margins of valleys 3 and 5. Scaling the Diff-ECs to independently control valley margins uses the characteristics of DPT calibrations (e.g., convergence of Diff-EC to a convergence value) to independently control the valley margins of a memory cell.

As noted above, being able to control valley margins independently for valleys within a logical page type or even across logical page types can be advantageous. For example, adjusting the width of a particular valley to be wider than one or more other valleys can address retention loss. In a multi-bit memory cell, the programming distributions with a higher voltage (e.g., programming distribution L7 of a TLC memory cell) tend to change over time (e.g. shift downward) more than programming distributions with lower voltages. Such changes can cause read errors and an increase in the error rate. If the valley margins between the programming distributions of higher voltages are independently programmed to be wider than the valley margins between programming distributions of lower voltages for a particular logical page type, the independent programming of valley margins can help address such challenges as retention loss.

FIG. 1 illustrates an example computing environment 100 that includes a memory sub-system 110 in accordance with some embodiments of the disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as a group of memory cells, wordlines, wordline groups (e.g., multiple wordlines in a group), or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (e.g., processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the disclosure, a memory sub-system 110 cannot include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a valley margin component 113 that performs operations as described herein. In some embodiments, the valley margin component 113 can be part of host system 120, controller 115, memory component 112N, an operating system, or an application. Valley margin component 113 can independently program any of the valley margins for a memory cell, or the memory cells in a WLG. For example, the controller 115 can include a processor 117 (processing device) configured to execute instructions stored in local memory 119 for performing the operations described herein.

Figure 2:
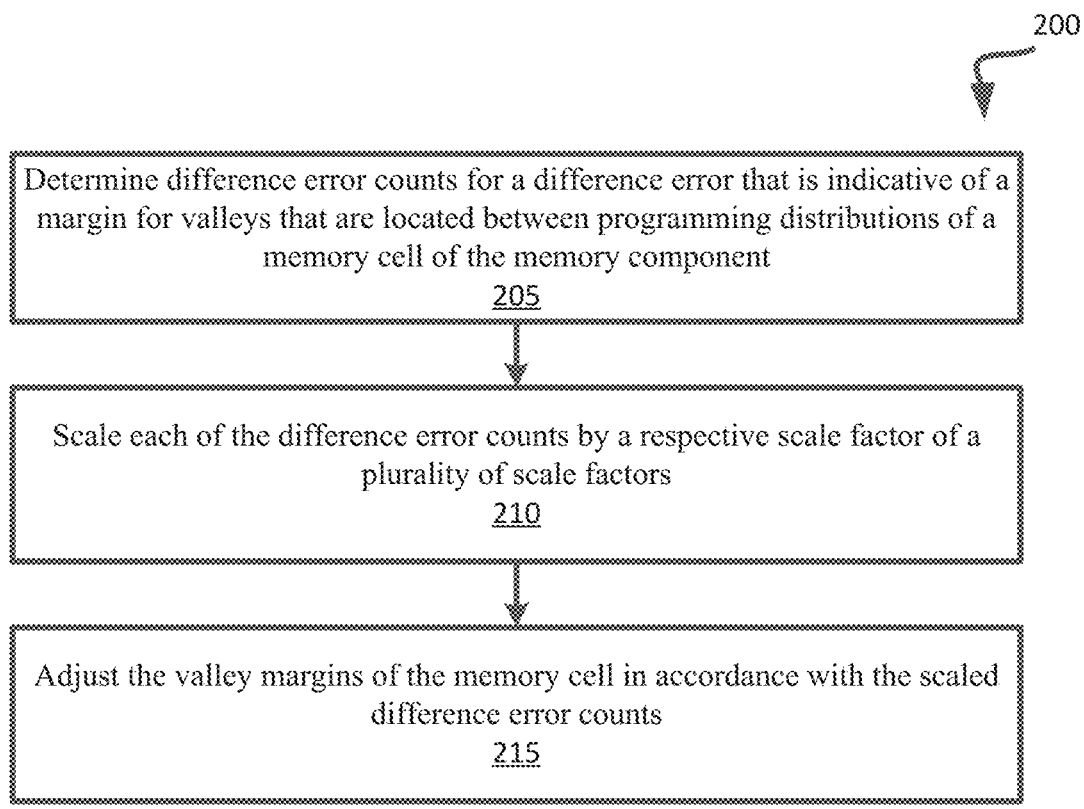
FIG. 2 is a flow diagram of an example method to independently adjust one or more valley margins, in accordance with some embodiments of the disclosure.

FIG. 2 is a flow diagram of an example method 200 to independently adjust one or more valley margins, in accordance with some embodiments of the disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof In some embodiments, method 200 is performed by the valley margin component 113 of FIG. 1. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other operations flows are possible. In some embodiments, different operations can be used.

At operation 205, processing logic determines one or more difference error counts (Diff-EC) for a difference error that is indicative of a margin for valleys that are located between programming distributions of a memory cell of the memory component. In embodiments, the programming distributions can be second pass programming distributions. In embodiments, the difference error is inversely proportional to the valley margins.

In some embodiments, to determine one or more difference error counts for a difference error, processing logic performs a continuous read level calibration (cRLC) operation on the memory cell to calibrate read level thresholds between the programming distributions.

In embodiments, to perform the cRLC operation on the memory cell to calibrate (also referred to as "converge" herein) the read level thresholds between the programming distributions, processing logic adjusts the read level thresholds to a center value that results in a lowest bit error rate. In embodiments, to perform a continuous read level calibration (cRLC) operation on the memory cell to calibrate read level thresholds between the programming distributions, processing logic samples the center value, a positive offset value, and a negative offset value between one or more of the programming distributions of the memory cell. The difference error count for a particular valley is determined using the center value, the positive offset value, and the negative offset value of the valley. The aforementioned values are measurements taken at a valley between adjacent programming distributions. A center value can be the lowest point in the valley. The positive offset value is a positive value (e.g., positive voltage value) from the center value. The negative offset value of the valley can be a negative value (e.g., negative voltage value) from the center value. In some embodiments, the positive offset value and the negative offset value are of the same magnitude. In some embodiments, Diff-EC is the mean of the positive offset value and the negative offset value less the center value. Center value, the positive offset value, and the negative offset value of the valley are further described at least with respect to FIG. 4A and 4B.

In one embodiment, when a read sample is taken, three reads are performed in sequence, including a low Vt read, a high Vt read, and a center Vt read. The center Vt read is a register value that is a cRLC center value, the low Vt read is a register value that is the cRLC center value less a negative offset value, and the high Vt read is a register value that is the cRLC center value plus a positive offset value. If a read threshold were to be swept by a BER sweep, ideally, the cRLC center value should be the lowest value in the valley between an adjacent pair of programming distributions. However, when the memory cell is not calibrated, the cRLC center value is not the lowest. In calibration, the cRLC operation centers the cRLC center value by balancing the side samples. In embodiments, in balancing the side samples the positive offset value and negative offset value are of equal magnitude. In some embodiments, to calibrate the read level thresholds, the cRLC operation balances the side samples for at least a particular logical page type. For example, for a particular logical page type all the respective positive offset values and the negative offset values are of equal magnitude for all the respective valleys. When the side samples are nearly equal (balanced), the cRLC center value can become centered at the deepest point in the BER sweep. For the read sample, a difference error count (Diff-EC) can be computed. More specifically, the Diff-EC measurement is the mean of the two side samples minus the center value. The Diff-EC is the difference between the average of the positive and negative offset sample bit error rate counts and the center sample bit error count. Also, the center bit error count (CenterBEC) is calculated. These values can be used to determine where the read level threshold should be set. The best BER for a logical page exists when all read level thresholds for that logical page type are centered by cRLC and the RWB for each logical page type valleys are approximately the same. The Diff-EC and CenterBEC can be stored and used by the DPT operation as feedback information in setting the PV targets. In some embodiments, after cRLC calibrates the read level thresholds between the programming distributions (e.g., second pass programming distributions), processing logic proceed to operation 210. The cRLC operation is further described below with respect to FIGS. 4A-4B.

At operation 210, processing logic scales each of the difference error counts by a respective scale factor of a set of scale factors. The set of scale factors can be a set of vectors used to scale the Diff-EC measurements. The scale factors can be a relative scaling factor that scales the Diff-ECs relative to one another, as well as scales respective valley margins relative to other valley margins. For example, a TLC memory cell can have eight programming distributions (L0-L7) and seven valleys (V1-V7). Each of the seven valleys can have a Diff-EC that is indicative of the valley margin of the particular valley. The Diff-EC can be inversely proportional to the valley margin. For example, if the Diff-EC of a particular valley increases, the valley margin of the particular valley decreases.

The scale factors for the seven Diff-ECs can be set of scale factors, such as [1.0, 1.0, 1.0, 1.0, 1.0, 1.0, 1.0, 2.0]. In the current example, the first six scale factors are associated with the Diff-EC of valley V1-V6 respectively, and the last scale factor (2.0) is associated with the Diff-EC of valley V7. The scale factors can be indicative of the relative width of the valley margin. In the current example using the aforementioned scale factors, valley margins of valleys V1-V6 are scaled to be roughly equal, while valley margin of valley V7 is scaled to have 2.0× margin of valleys V1-V6. The set of scale factors can be stored in memory and used to scale the Diff-ECs and adjust the valley margins. In some implementations, multiple sets of scale factors can be stored in memory. Responsive to satisfying certain conditions, a particular one of the multiple sets of scale factors associated with the satisfied condition can be retrieved and used to scale the Diff-ECs.

In an embodiment, scaling the difference error counts by the respective scale factors can be performed by multiplying the respective scale factors of the set of scale factors with the respective Diff-EC measurements obtained by using the cRLC operation to calibrate the read level thresholds between the programming distributions. The cRLC operation can provide the Diff-EC measurements that are subsequently scaled.

At operation 215, processing logic adjusts the valley margins of the memory cell in accordance with the scaled difference error counts.

In some embodiments, to adjust the valley margins of the memory cell in accordance with the scaled difference error counts, processing logic performs a dynamic program targeting (DPT) operation on the memory cell to calibrate one or more program-verify (PV) targets associated with the programming distributions based on the scaled difference error counts. In some embodiments, the DPT operation converges respective scaled error counts of the multiple scaled error counts for at least a particular logical page type of the memory cell to a convergence value.

In embodiments, the DPT operation calibrates the memory cell by adjusting one or more PV targets. The DPT calibration also converges Diff-EC (non-scaled Diff-EC or scaled Diff-EC) for at least a particular logical page type to a convergence value. As noted above, DPT calibration or convergence can include balancing the BER of each logical page type so that each valley associated with a particular logical page type has roughly similar BER. In so doing, DPT calibrations converges Diff-ECs for at least a particular logical page type to a convergence value. For example, after cRLC convergence, the Diff-EC measurements obtained via the cRLC operation are passed to DPT. For a TLC memory cell, DPT calibration converges the Diff-EC measurements for valleys 1-7 to a convergence value (e.g., Diff-EC of approximately 60) so that each valley has roughly similar RWBs. It can be noted that in some embodiments, that a particular programming distribution can be fixed (e.g., programming distribution L0), and the Diff-EC of the valley (e.g., valley 1) associated with the particular fixed programming distribution is not calibrated to a convergence value. In situations where the scaled Diff-EC is used, the DPT operation calibrates the memory cells so that the scaled Diff-ECs are converged to the particular convergence value. As noted above, Diff-EC is inversely proportional to valley margin. As Diff-EC is increased, valley margin for the respective valley decreases, and vice versa. Similarly, if the Diff-ECs for some valley are roughly the same, the respective valley margins for the valleys are also roughly the same. For example, if valleys 1-7 all have a Diff-EC of 60 counts, then the valley margins of valleys 1-7 are all roughly the same. When Diff-ECs are scaled, DPT converges the scaled Diff-ECs to a convergence value. For example, cRLC can return a Diff-EC of valley 7 (V7) as 60 counts. Valley 7 can be scaled by a scale factor of 2.0, which makes the scaled Diff-EC for valley 7 at 120 counts. As noted above, the other valleys 1-6 are scaled by a scale factor of 1. For purposes of illustration, the Diff-ECs of valleys 1-6 are all 60 counts, and the scaled Diff-ECs of valleys 1-6 are also 60 counts. DPT calibration moves the appropriate PV targets so that the scaled Diff-EC of 120 counts moves to the convergence value of 60 counts. After DPT calibration, the scaled Diff-EC of 60 counts for valley 7 is actually an un-scaled value of 30 counts. The unscaled Diff-EC of valley 7 of 30 counts is half of the Diff-ECs (scaled or unscaled) of valleys 1-6. Since Diff-EC is inversely proportional to valley margin and that valley margin is a relative measurement, the valley margin of valley 7 is approximately 2× the width of the valley margins of valleys 1-6. In embodiments, the valley margins of the memory cell are adjusted dynamically during operation of the memory component.

In some embodiments, to perform a dynamic program targeting (DPT) operation on the memory cell to calibrate the one or more PV targets associated with the programming distributions, processing logic determines a first adjustment amount of a first PV target and a second adjustment amount of a second PV target that converges at least two of the scaled error counts to a convergence value. Processing logic adjusts the first PV target by the first adjustment amount and adjusts the second PV target by the second adjustment amounts.

In some embodiments, to calibrate the one or more PV targets associated with the programming distributions, processing logic determines a net-zero adjustment to at least two PV targets associated with the programming distributions based on two or more scaled difference error counts. Processing logic adjusts the at least two PV targets according to the net-zero adjustment. In some embodiments, not all PV targets are adjusted. For example, the first and last PV targets can be fixed and only the intervening PV targets are adjusted. Net-zero adjustments are further described with respect to FIG. 4C.

In another embodiment, the memory component includes a block with multiple memory cells organized in wordlines and wordline groups. The memory cell can be a sample cell of a first wordline group of the multiple wordline groups. The block can further include a second sample memory cell in a second wordline group of the multiple wordline groups. In embodiments, the valley margins of a wordline group of multiple wordline groups of a block are adjusted independently from valley margins other wordline groups of the multiple wordline groups of the block. In some embodiments, the valley margins of a wordline of multiple wordlines of a block are adjusted independently from valley margins of other wordlines of the multiple wordlines of the block. In one embodiment, the memory cell, after the first programming pass, includes the $1^{st}$ Vt distribution, the $2^{nd}$ Vt distribution, a third first-pass programming distribution ($3^{rd}$ Vt distribution), and a fourth first-pass programming distribution ($4^{th}$ Vt distribution). The read level threshold is between the $1^{st}$ Vt distribution and the $2^{nd}$ Vt distribution as described above. Also, a second read level threshold is between the $2^{nd}$ Vt distribution and the $3^{rd}$ Vt distribution, and a third read level threshold is between the $3^{rd}$ Vt distribution and the $4^{th}$ Vt distribution. The memory cell, after the second programming pass, includes eight Vt distributions, eight PV targets, and seven read level thresholds, each between two of the eight Vt distributions. In embodiments, adjusting the valley margins can be performed after the second programming pass. Additional details of the multi-pass programming sequences are described and illustrated with respect to FIGS. 5-8.

Operations described herein can be performed on a data block (e.g., a group of memory cells), a word line group, a word line, or individual memory cells. For example, the operations described with respect to a memory cell in the disclosure can also be used with a data block that is a group of memory cells.

Figure 3:
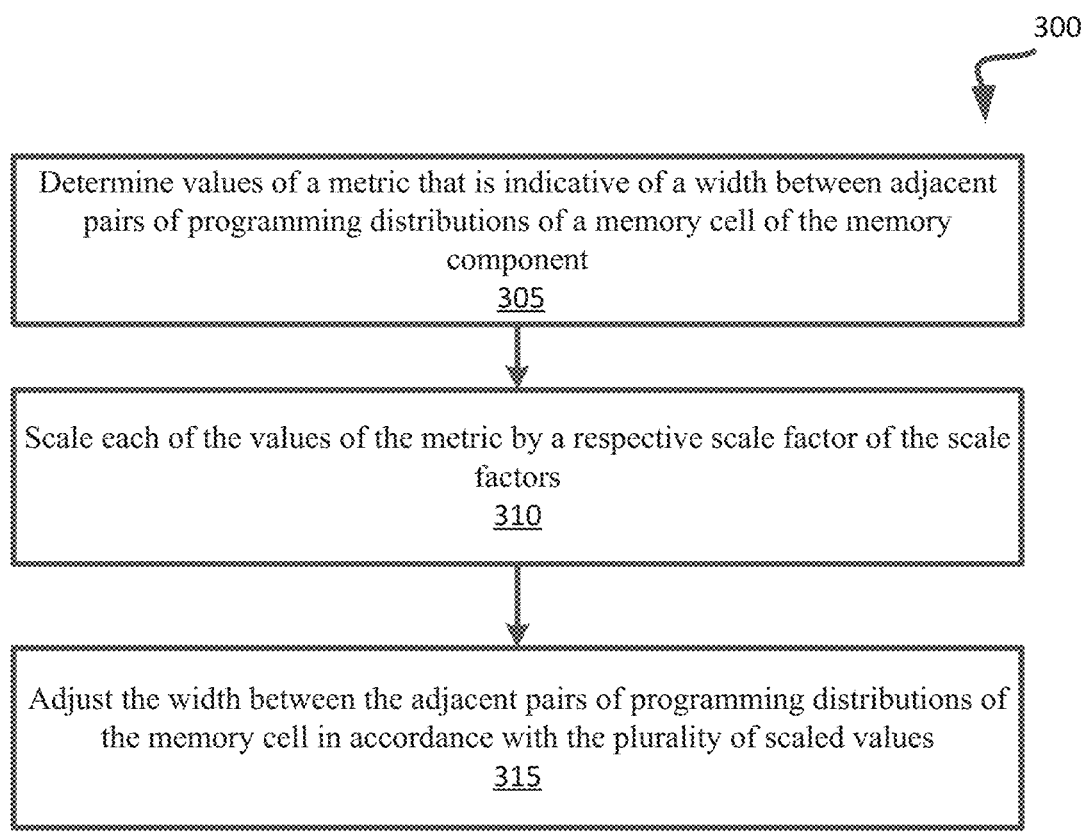
FIG. 3 is a flow diagram of an example method to independently adjust the width between adjacent pairs of programming distributions, in accordance with some embodiments of the disclosure.

FIG. 3 is a flow diagram of an example method 300 to independently adjust the width between adjacent pairs of programming distributions, in accordance with some embodiments of the disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof In some embodiments, the method 300 is performed by the valley margin component 113 of FIG. 1. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other operations flows are possible. In some embodiments, different operations can be used.

At operation 305, processing logic determines values of a metric that is indicative of a width between adjacent pairs of programming distributions of a memory cell of the memory component. In embodiments, the metric can be an error count and the values can be difference error counts. In other embodiments, the metric can be other than an error count. In an embodiment, the metric is indicative of a relative width between respective adjacent pairs of programming distributions associated with one or more logical page types. In an embodiment, the metric is inversely proportional to the width between the adjacent pairs of programming distributions.

In an embodiment, to determine the values of the metric that is indicative of the width between adjacent pairs of programming distributions of the memory cell, processing logic calibrates read level thresholds between the programming distributions so that the read level thresholds are adjusted to a center value that results in a lowest bit error rate.

At operation 310, processing logic scales one or more of the values of the metric by a respective scale factor of the scale factors.

At operation 315, processing logic adjusts the width between the adjacent pairs of programming distributions of the memory cell in accordance with the scaled values. In some embodiments, to adjust the width between the adjacent pairs of programming distributions of the memory cell in accordance with the scaled values, processing logic calibrates one or more program-verify (PV) targets associated with the programming distributions based on the scaled values so that respective scaled values associated with at least one particular logical page type converge to a convergence value.

Figures 4A, 4B:
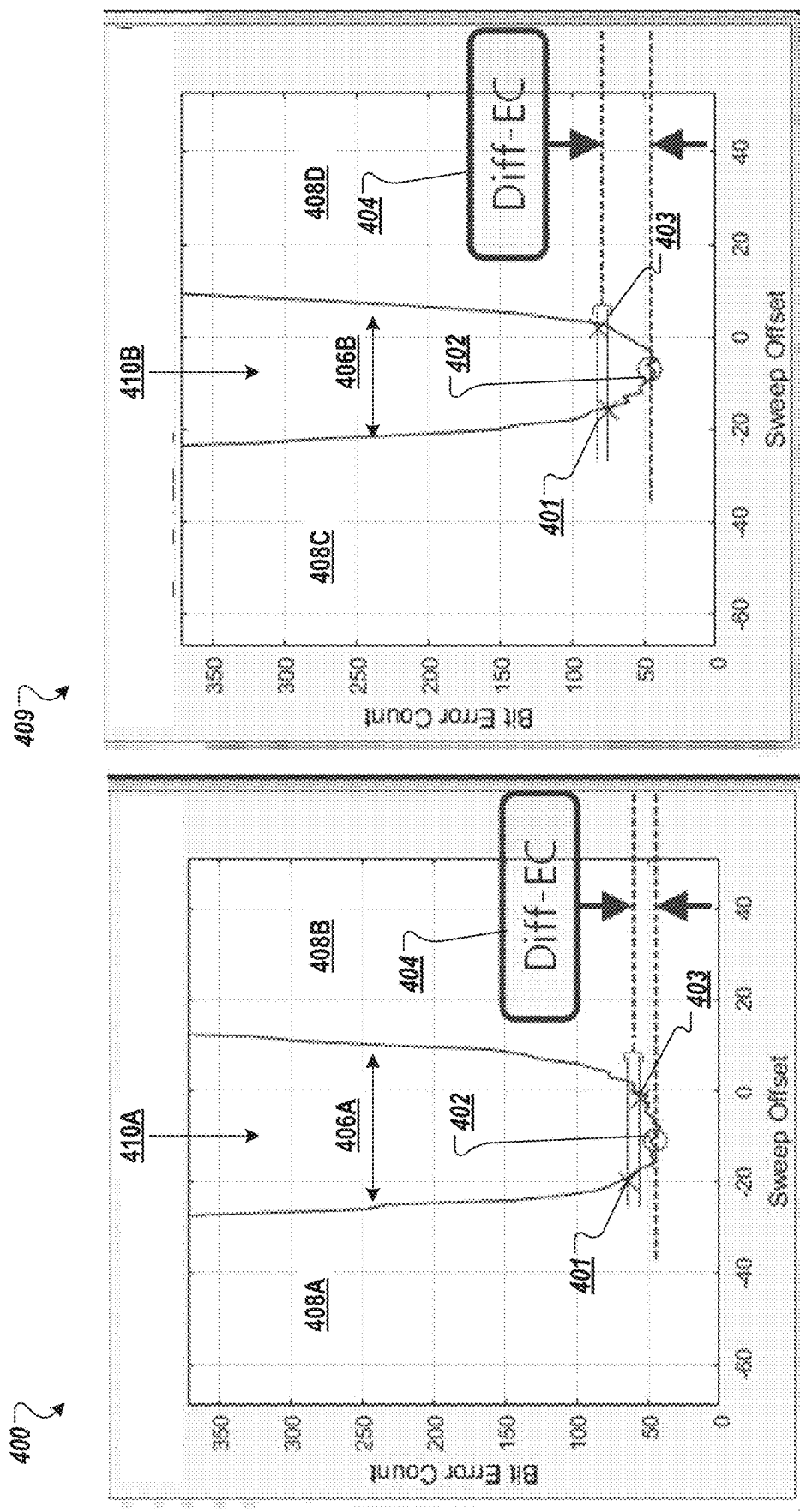
FIGS. 4A-4B illustrate difference error counts of two read level thresholds between two adjacent program distributions, in accordance with some embodiments of the disclosure.

FIGS. 4A-4B illustrate difference error counts of two read level thresholds between two adjacent program distributions, in accordance with some embodiments of the disclosure. Graph 400 shows a valley 410A between a pair of adjacent programming distributions 408A and 408B. Valley 410A-B can refer to the area between two adjacent distributions. Valley margin 406A is also shown between programming distributions 408A and 408B. Graph 409 shows a valley 410B between a pair of adjacent programming distributions 408C and 408D. Valley margin 406B is also shown between programming distributions 408C and 408D. As noted above, valley margin 406A-B can refer to a relative width or relative margin between pairs of adjacent programming distributions. One or more of programming distributions 408A-408D are generally referred to as "programming distribution(s) 408" herein. One or more of margin valleys 406A-406B are generally referred to as "margin valley(s) 406" herein. One or more of valleys 410A-410B are generally referred to as "valley(s) 410" herein.

The cRLC operation samples each logical page type in each WLG. Each sample can include 3 reads: low-sample 401 (also referred to as "negative offset value" herein), center-sample 402 (also referred to as "center value" herein), and high-sample 403 (also referred to as "positive offset value" herein). As noted above, the cRLC operation calibrates or converges by obtaining a center value that results in a lowest bit error rate (BER). Convergence is when a read level trim has the value that returns the fewest number of page or code word errors. This is what is called the calibrated or centered value and results in the best BER. In addition to finding the center of the valley 410, the cRLC operation calibrates or converges by balancing the side samples (low-Sample 401 and High-Sample 403) so that that the low-sample 401 and the high-sample 403 are equal in magnitude for a particular valley and the other valleys associated with a particular logical page type. In some embodiments, the low-sample 401 and the high-sample 403 are equal in magnitude for all the valleys for all the logical page types (or for multiple logical page types). In some embodiments, the low-sample 401 and the high-sample 403 are equal in magnitude for at least some valleys of a particular logical page type. Graph 400 and graph 409 show examples of calibrated valleys with the center samples 402 being balanced between the side samples (e.g., the 4 side samples in both graph 400 and 410 are roughly equal in magnitude). Graph 409 demonstrates wide valley behavior 410 and graph 409 demonstrates narrow valley behavior. During cRLC sampling and updating, when the read level trims (e.g., trim registers) are centered, the value of the trim will start "dithering." Anytime a cRLC read level trim changes direction (increasing the trim value, then decreasing the trim value, and vice versa) is considered a dither. This action of dithering indicates the trim is centered. When dithering occurs for a trim, the center value will be set.

The center-samples 402 are used as feedback metrics by DPT to equalize the LP/UP/XP error rates by moving PV targets slightly. But, center-samples 402 are enough to equalize the BER between the logical page types (LP/UP/XP). For each logical page type, the valley margin can also have a reasonable match. The default PV targets can determine the depths of the valleys 410 between the program distributions 408, the depths being related to valley margin 406 of each valley 410. To determine the valley margin 406 of a program distribution 408, the cRLC operation can determine values of a metric that is indicative of the width (or depth) between adjacent pairs of programming distributions 408. In some embodiments, the metric is a difference error and values of the metric are difference error counts (Diff-EC) (also referred to as "Diff-EC measurement(s)" herein). The difference error can be inversely proportional to the valley margins. For example, as illustrated the Diff-EC of graph 400 is smaller than the Diff-EC of graph 409, and valley margin 406A of graph 400 is larger than valley margin 406B of graph 409. The cRLC operation can determine the Diff-EC measurements 404. The Diff-EC measurements 404 can be used to identify relative valley margins. The Diff-EC measurements 404 can be the mean of the two side samples 401, 403 minus the center value 402. The DPT operation can perform BER leveling by moving PV targets to match not only the error counts between logical page types, but also match the valley margins within each logical page type (or within all the logical page types). It can also be noted that valley margin can be correlated to valley depth (e.g., from peak to trough between program distributions). For example, a deep valley can correlate to a narrower valley margin as compared to a shallow valley (e.g., less deep valley) that correlates to a wider valley margin.

It can be noted that the ECs of the center-samples 402 match when multiple valleys associated with logical pages are being measured (UP & XP). It can also be noted that the center-sample bit EC can be the error count of the center-sample 402 (e.g., vertical axis of graph 400 and 410). Despite the center-sample ECs matchings, the valley margin (or depth) can be dramatically different even within the valley of different logical page types (UP & XP). To determine which valley has the largest valley margin or the smallest valley margin, the measure of Diff-EC can be reliably used. The higher the Diff-EC measurement 404, the narrower the valley margin (or the RWB is smaller). The offsets between the Low-Sample 401, Center-Sample 402, and High-Sample 403 for different Diff-EC measurements 404 are equal for purposes of comparison. In some embodiments, the cRLC operation can keep multiple samples (e.g., 16 samples) of each cRLC trim of each die. Once all the cRLC trim is centered, the center-samples 402 and Diff-EC measurements 404 can be stored for a subsequent execution of a DPT operation. As illustrated, the example of FIG. 4A has a lower Diff-EC measurement 404 than the example of FIG. 4B, which means the program distributions have a larger valley margin and is less-needy. The terms More-Needy and Less-Needy refer to the relative valley margin of valleys which apply to the same logical page type within a WLG. In other words, the Most-Needy valley for a logical page type will be the one that is dominating the Error Count or contributing more BER loss for the particular logical page type than any other valley. The Diff-EC measurements can be used to determine More-Needy vs. Less-Needy valleys, including the order of Needy-Ness (most to least needy). When a TLC page stack page BER is balanced, the LP (L3/L4) will have the lowest RWB, the UP (L1/L2 and L5/L6) will be a bit higher and should be about equal, and XP (L2/L3, L4/L5, and L6/L7, notice that L0/L1 is ignored because it is special) will be the highest RWB. Accordingly, the valleys of LP will have the lowest valley margins, the valleys of UP will have a bit higher valley margin, and the valleys of XP will have the highest valley margin. It should be noted that a balanced BER causes the RWB for valleys of a particular logical page type to gravitate to the definition described above, which occurs as a natural byproduct of the DPT operation, described in more detail below.

Figure 4C:
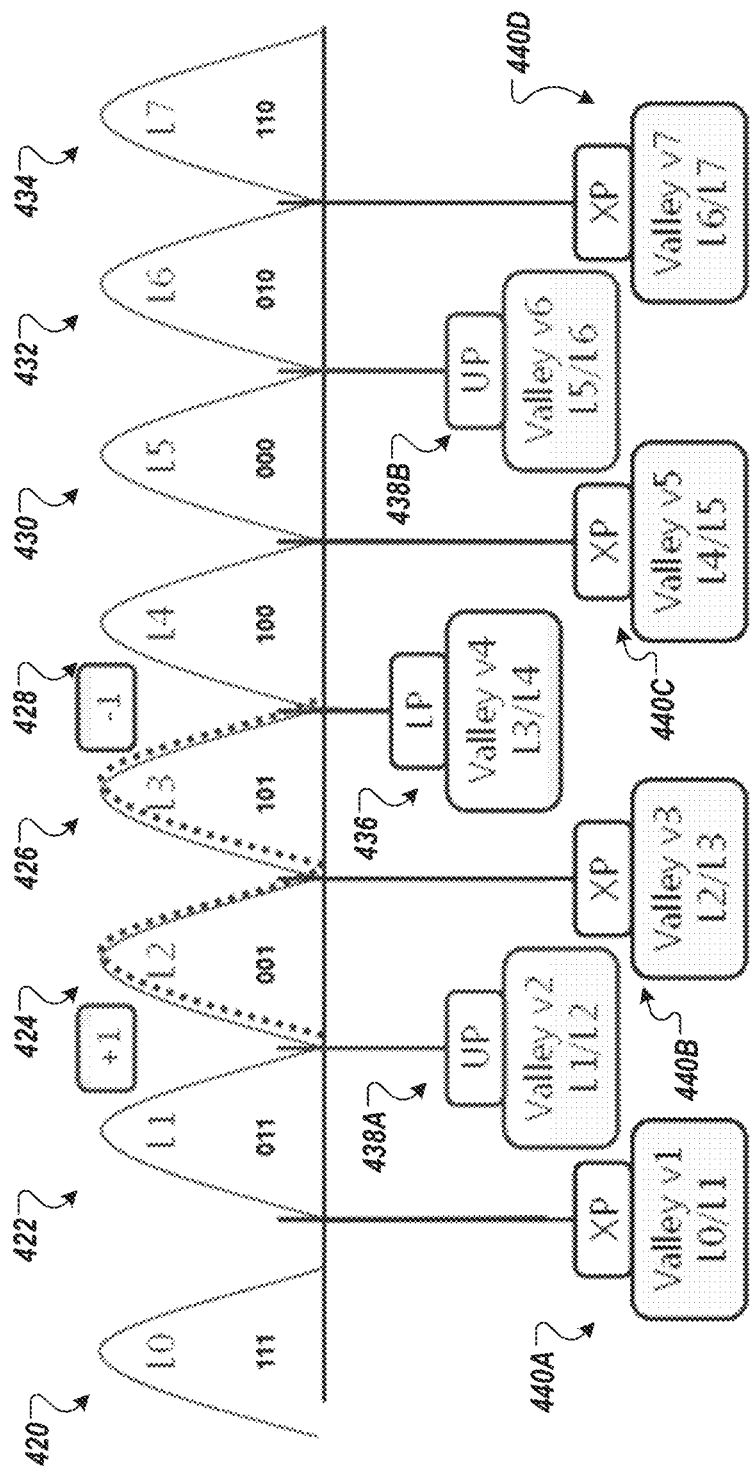
FIG. 4C illustrates eight programming distributions, including two programming distributions after at least two PV targets are adjusted according to a DPT operation, in accordance with some embodiments of the disclosure.

FIG. 4C illustrates eight programming distributions, including two programming distributions after at least two of PV targets are adjusted according to a DPT operation, in accordance with some embodiments of the disclosure. As illustrated in FIG. 4C, most of the data in each block is stored as TLC information, including 3 bits per cell. This is accomplished using eight programming distributions 420-434. A lower logical page (LP) is defined with one read level threshold 436 (e.g., approximately at the center between programming distributions 426 and 428). An upper logical page (UP) is defined with two read level thresholds 438A and 438B (generally referred to as "read level threshold(s) 438" herein). An extra logical page (XP) is defined with fourth read level thresholds 440A-440D (generally referred to as "read level threshold(s) 440" herein). The eight programming distributions 420-434 each correspond to a level (L0:L7), each level corresponding to a code (000b:111b). Between each pair of eight programming distributions 420-434 is a valley, totaling seven valleys (v1:v7). A center or peak of each programming distribution 420-434 corresponds to a PV target for the respective programming distribution 420-432. In total, there can be eight PV targets for a 3-bit representation. In some embodiments, the first programming distribution 420, corresponding to the first level L0, has a fixed PV target. In some embodiments, the eighth programming distribution 434, corresponding to the eighth level L7, can have a fixed PV target. Using DPT operations, the PV targets of the intervening programming distributions, corresponding to levels L1-L6, can be adjusted. In some embodiments, all or some of the PV targets corresponding to programming distributions 420-432 can be adjusted or fixed.

In the depicted embodiment, the DPT operation starts with each PV target in a default state as defined by factory settings. In some cases, all PV targets are adjusted, but in other embodiments, the first PV target and the last PV target can be fixed, allowing the intervening PV targets to be adjusted. For example, with eight PV targets (of L0-L7), the L0 and L7 PV targets are fixed and the other PV targets L1 through L6 can receive characterized starting values, leading to faster cRLC and DPT operation conversion. Alternatively, the L0, L1, and L7 PV targets are fixed and the other PV targets L2-L6 can be adjusted. These factory settings of the PV targets and read thresholds can produce undesirable BER results before cRLC and DPT operations.

The DPT operation can be defined as a net-zero PV target adjustment mechanism. Net-zero adjustments maintain a constant RWB for a memory cell. The total RWB for a memory cell of a multi-bit memory cell is constant, but the RWB between programming distributions can be adjusted by changing PV targets. Net-zero adjustments manages PV target adjustments for optimum BER and logical page type BER matching. This is another way of stating that, the L0 and L7 PV targets are fixed and adjustments to PV targets between L0 and L7 (L1:L6) are managed such that logical page type BER is continuously matched. The DPT operation performs PV target adjustments in order to balance logical page type BER for improved BER sigma continuously throughout the life of a memory component or memory system. The DPT operation, as described herein, can be performed between programming passes of a multi-pass programing operation, such as after a first programming pass or a second programming pass. The cRLC calibration is performed in order to perform a subsequent DPT operation. The cRLC measures and collects valley and difference error count information on the page stack and passes the information to a subsequent DPT operation. Both cRLC and DPT can be performed while a block is being programmed rather than after a block is fully programmed.

In embodiments, during programming of the selected block used for DPT, the programming sequence is interrupted to perform cRLC. Programming interruption occurs at each logical page stack (selected as one of the cRLC logical page stacks). A logical page stack can refer to all the logical page types for a particular multi-bit memory cell. The program interruption occurs just before the second-pass programming when the first-pass distributions have fully aggressed floating gate coupling from their neighbors. During block programming each of the cRLC page stacks in each of the wordline groups is interrupted and a cRLC is performed until all read level thresholds of the page stack are centered. The cRLC information from each valley, Center Bit Error Count (CenterBEC) and Difference Error Count (Diff-EC), is passed to the DPT operation for determining Program Verify (PV) Target adjustments according to the DPT rules. PV target adjustments are applied to the next block that is programmed and this process of interrupting and cRLC/DPT continues as DPT converges and finally dithers and then tracks NAND behavior. As noted above, by adjusting PV targets, DPT effectively moves the program distributions in the direction of the adjusted PV targets. DPT balancing or calibration (e.g., adjusting the PV targets) can result in valley margins of a particular logical page type to converge at a particular convergence value so that the valley margins for a particular logical page type are roughly the same. DPT calibration or convergence can include balancing the BER of each logical page type so that each valley associated with a particular logical page has roughly similar RWB. During DPT PV target adjustment, when that value of the PV trim starts "dithering" (anytime a PV trim changes direction (increasing the trim value, then decreasing the trim value, and vice versa) is considered a dither), the DPT operation for the respective program distribution has converged.

In one embodiment, there are only 5 of the 8 TLC distributions adjusted in the DPT operation. The program targets for L2, L3, L4, L5, and L6 move while the program targets for L0, L1, and L7 remain fixed. As shown in FIG. 4C, the PV targets for L2 and L3 are adjusted. The program target offsets are tracked over a number of updates. A program target offset is defined as the difference in position of a PV distribution relative to the default starting value. For example, the PV targets for L2 and L3 first slew to the right by a certain amount (e.g., by about 130 mv) and then stop slewing and start dithering, which is stabilization (or calibrated). The valley after L3 is the L3/L4 valley (v4), the center value of which is the read level threshold 436 (corresponding to the LP Read Level). This movement is caused by balancing the BER of the LP page to other logical pages. All PV targets can be stabilized after a number of PIE cycles (e.g., ~40 P/E cycles). It can take some time to stabilize the PV targets as the operation alternates between LP/UP and LP/XP adjustments with a maximum movement of 1 click (e.g., 10 mv). It is possible to characterize these offsets in many die, producing a head start set of offsets, providing BER equalization at time zero.

As described herein, BER balancing can be performed as a net-zero adjustment. As illustrated in FIG. 4C, one click (e.g., 10 mv) is given to one level (e.g., labeled as +1) and one click (10 mv) is taken from another level (e.g., labeled as −1). DPT operations can adjust both UP and XP relative to LP, resulting in equalization of all three TLC page types. It should be noted that it is possible to give more RWB to higher distributions if required for undesirable NAND behavior like retention for example.

Figure 5:
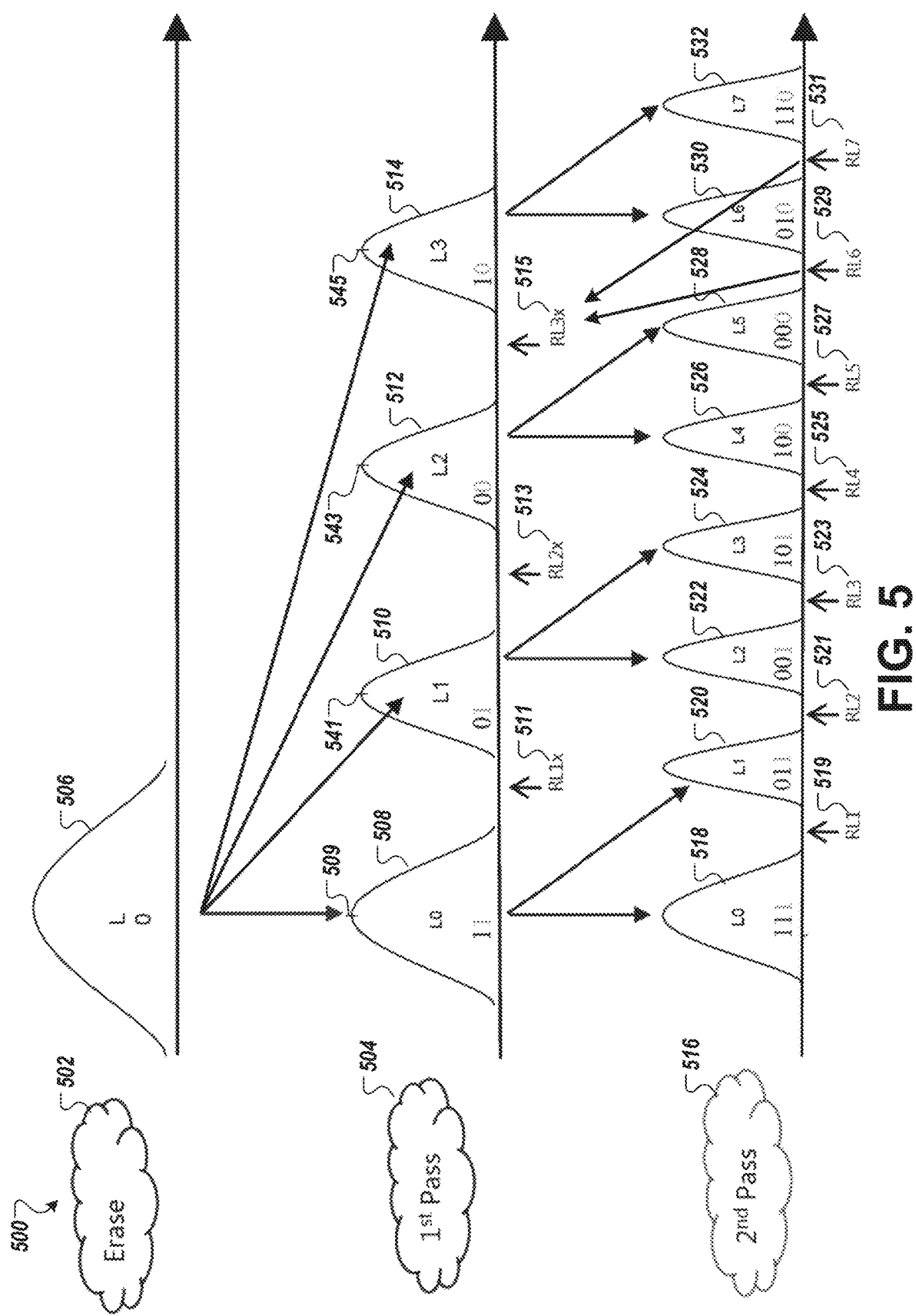
FIG. 5 illustrates a two-pass programming operation with four-to-eight programming distributions and corresponding read level thresholds, in accordance with some embodiments of the disclosure.

FIG. 5 illustrates a two-pass programming operation 500 with four-to-eight programming distributions and corresponding read level thresholds, in accordance with some embodiments of the disclosure. Before a first programming pass 504, a memory cell is in an erased state 502 and has a single Vt distribution 506 (also referred to as an "erase distribution" herein). After the first programming pass 504, the memory cell has four Vt distributions 508, 510, 512, 514 (also referred to as "programming distributions" or "first-pass programming distributions" herein) and three read level thresholds 511, 513, and 515.

In some embodiments, before a second programming pass 516, the cRLC operation can be performed to calibrate one or more of the read level thresholds 511, 513, and 515. The read level thresholds 511, 513, and 515 can be adjusted to maintain minimum BER settings throughout the life of the memory cell and track variations in valley positions due to program/erase cycles, temperature, retention, or other factors. The read level thresholds 511, 513, and 515 can have corresponding trim values for the first programming pass 504 and these values can be adjusted to achieve a specified BER setting for the respective trim. Separate trims can exist for the read level thresholds of the cell after the first programming pass 504 and for the read level thresholds of the cell after the second programming pass 516. After the cRLC operation is performed to calibrate one or more of the read level thresholds 511, 513, and 515, the DPT operation is performed to calibrate two or more PV targets 509, 541, 543, and 545. In some embodiments, the first and last PV targets 509 and 545 can be fixed, and the PV targets 541 and 543 are adjusted. It should be noted that PV targets 509, 541, 543, and 545 are illustrated as the centers of the respective programming distributions to represent the PV targets used that result in the respective programming distributions. For example, by adjusting the PV targets to the right by a certain amount results in the programming distribution being centered at the point that is to the right by the certain amount. The programming distribution effectively shifts to the right by the certain amount. After the first cRLC operation and the first DPT operation are performed, the second programming pass 516 can be performed. After the second programming pass, the memory cell has eight Vt distributions 518, 520, 522, 524, 526, 528, 530, and 532 (also referred to as second-pass programming distributions) and seven read level thresholds 519, 521, 523, 525, 527, 529, and 531. The second programming pass 516 uses the data stored at the memory cell that was programmed during the first programming pass 504, as illustrated in FIG. 5. In another embodiment, another cRLC operation can be performed to calibrate one or more of the eight read level thresholds after the second programming pass 516, such as before a third programming pass. That is, the cRLC operation can be performed before one or more subsequent programming pass operation in a multi-pass programming sequence. It can be noted that the first cRLC operation is optional in some embodiments.

In some embodiments, a first programming pass 504 of a multi-pass programming operation is performed on the memory component resulting in first pass programming distributions 508, 510, 512, and 514. A cRLC operation is not performed after the first programming pass 504 and before the second programming pass 516 of a multi-pass programming operation. Rather, before the second programming pass 516 the read level thresholds 511, 513, and 515 can be programmed to default trim values. Subsequent to programming the read level thresholds 511, 513, and 515 to default trim values, the second programming pass 516 can be performed. After the second programming pass 516, the cRLC operation can be performed to calibrate one or more of the read level thresholds 519, 521, 523, 525, 527, 529, and 531. The read level thresholds 519, 521, 523, 525, 527, 529, and 531 can have corresponding trim values and the trim values can be adjusted to achieve a specified BER setting. In some embodiments, performing the cRLC operation on the memory component to calibrate the read level thresholds 519, 521, 523, 525, 527, 529, and 531 between the second pass programming distributions 518, 520, 522, 524, 526, 528, 530, and 532 can include adjusting one or more of the read level thresholds 519, 521, 523, 525, 527, 529, and 531 to a center value that results in a lowest bit error rate (e.g., converged).

Figure 6:
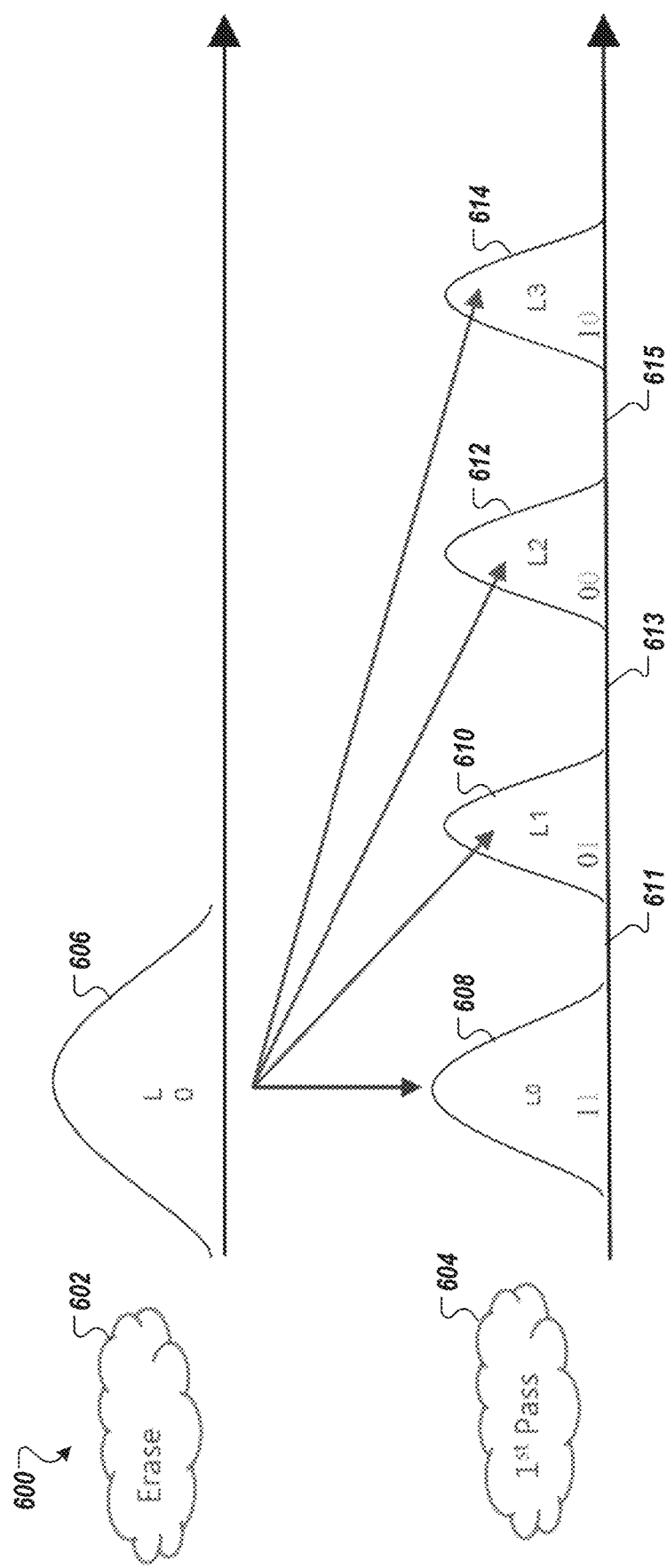
FIG. 6 illustrates a first-pass four-level programming operation with four Vt distributions, in accordance with some embodiments of the disclosure.

FIG. 6 illustrates a first-pass four-level programming operation 600 with four Vt distributions, in accordance with some embodiments of the disclosure. Before a first programming pass 604, a memory cell is in an erased state 602 and has a single Vt distribution 606. The first programming pass 604 programs four levels of the memory cell, including a lower logical page and an upper logical page of a page stack. That is, after the first programming pass 604, the memory cell has four Vt distributions 608, 610, 612, 614 and three read level thresholds 611, 613, and 615. In an embodiment, once the first programming pass 604 is performed, the cRLC operation can be performed to calibrate one or more of the read level thresholds 611, 613, and 615. In one embodiment, the read level threshold 611 can be calibrated to be centered between the Vt distribution 608 and the Vt distribution 610, the read level threshold 613 can be calibrated to be centered between the Vt distribution 610 and the Vt distribution 612, and the read level threshold 615 can be calibrated to be centered between the Vt distribution 612 and the Vt distribution 614. In another embodiment, any combination of the read level thresholds 611, 613, and 615 can be calibrated and the remaining one or more of the read level thresholds 611, 613, and 615 can be programmed in other subsequent programming operations to spread out the calibration of the read level thresholds over time. To calibrate the read level threshold 611, the cRLC operation can iteratively perform a read operation on the memory cell and iteratively measure a BER of the memory cell. The cRLC operation can adjust the read level threshold based on the BER that centers the read level threshold between the Vt distribution 608 and Vt distribution 610. In another embodiment, to calibrate the read level threshold 611, the cRLC operation calculates a CenterBEC and a Diff-EC and uses these values to adjust the read level threshold 611. The read level thresholds 613 and 615 can be calibrated similarly in this same programming operation or in one or more subsequent operations as described herein. The read level thresholds 611, 613, and 615 can be adjusted to maintain minimum BER settings throughout the life of the memory cell and track variations in valley positions due to program and erase cycles, temperature, retention, or other factors. After the cRLC operation is performed to calibrate one or more of the read level thresholds 611, 613, and 615, the DPT operation is performed to calibrate two or more PV targets. After the cRLC operation and the DPT operation are performed, a subsequent programming pass can be performed (not illustrated in FIG. 6). The read level thresholds 611, 613, and 615 can have corresponding trim values for the first programming pass 604 and these values can be adjusted to achieve a specified BER setting for the respective trim. These trim values can be separate values from those used for a subsequent programming pass. In one embodiment, the cRLC operation described with respect to FIG. 6 can be used in a memory system with MLCs. Alternatively, the cRLC operation can be used in a memory system with other memory types where multi-pass programming operations are performed.

Figure 7:
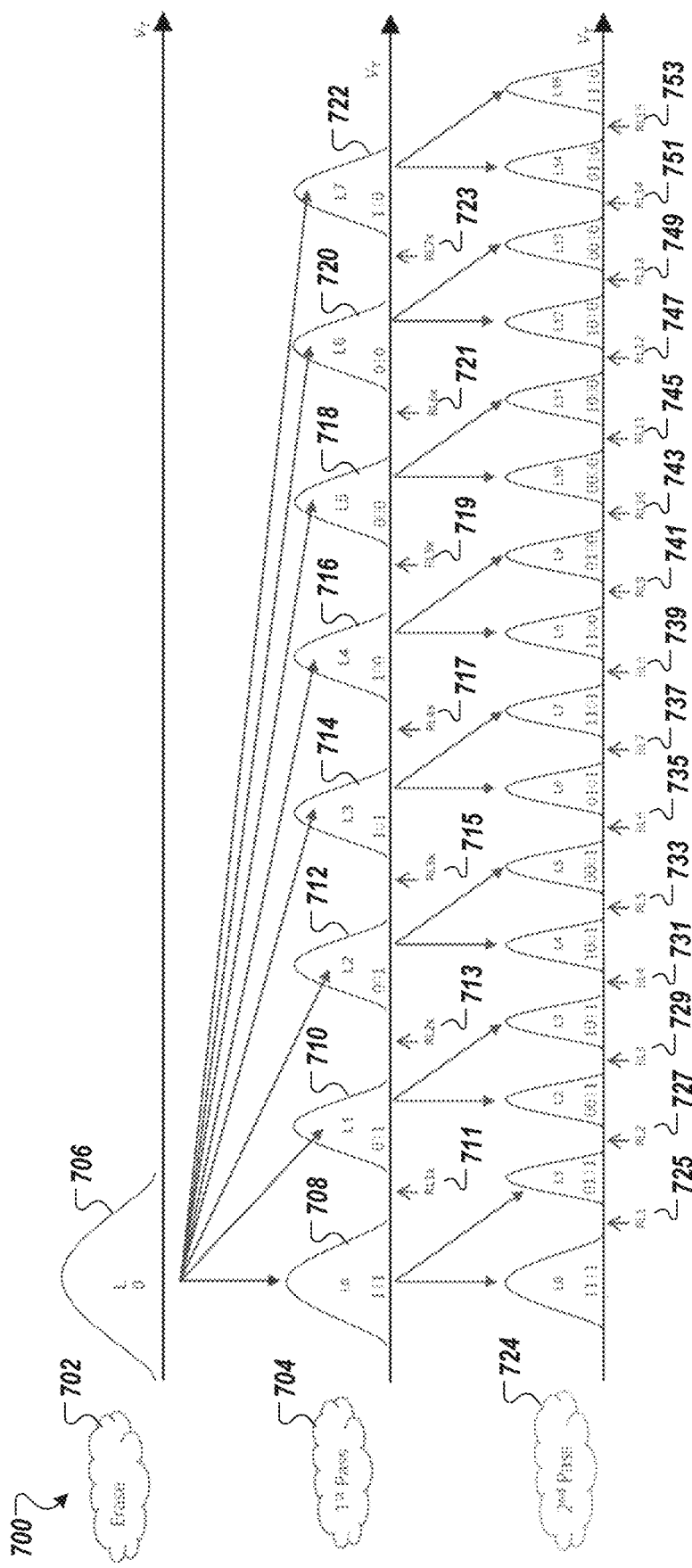
FIG. 7 illustrates a two-pass programming operation with eight-to-sixteen programming distributions and corresponding read level thresholds in accordance with some embodiments of the disclosure.

FIG. 7 illustrates a two-pass programming operation 700 with eight-to-sixteen programming distributions and corresponding read level thresholds in accordance with some embodiments of the disclosure. Before a first programming pass 704, a memory cell is in an erased state 702 and has a single Vt distribution 706. After the first programming pass 704, the memory cell has eight Vt distributions 708, 710, 712, 714, 716, 718, 720, and 722 and seven read level thresholds 711, 713, 715, 717, 719, 721, and 723. Before a second programming pass 724, the cRLC operation can optionally be performed to calibrate one or more of the read level thresholds 711, 713, 715, 717, 719, 721, and 723. The read level thresholds 711, 713, 715, 717, 719, 721, and 723 can be adjusted to maintain minimum BER settings throughout the life of the memory cell and track variations in valley positions due to program and erase cycles, temperature, retention, or other factors. The read level thresholds 711, 713, 715, 717, 719, 721, and 723 can have corresponding trim values for the first programming pass 704 and these values can be adjusted to achieve a specified BER setting for the respective trim. Separate trims can exist for the read level thresholds of the cell after the first programming pass 704 and for the read level thresholds of the cell after the second programming pass 724.

In one embodiment, the read level threshold 711 can be calibrated to be centered between the Vt distribution 708 and the Vt distribution 810. Similarly, the read level thresholds 713-723 can be centered between the respective pairs of Vt distributions. In another embodiment, any combination of the read level thresholds 711, 713, 715, 717, 719, 721, and 723 can be calibrated and the remaining one or more of the read level thresholds 711, 713, 715, 717, 719, 721, and 723 can be programmed in other subsequent programming operations to spread out the calibration of the read level thresholds over time. To calibrate the read level threshold 711, the cRLC operation can iteratively perform a read operation on the memory cell and iteratively measure a BER of the memory cell. The cRLC operation can adjust the read level threshold based on the BER that centers the read level threshold between the Vt distribution 708 and Vt distribution 710. In another embodiment, to calibrate the read level threshold 711, the cRLC operation calculates a CenterBEC and a Diff-EC and uses these values to adjust the read level threshold 711. The read level thresholds 713-723 can be calibrated similarly in this same programming operation or in one or more subsequent operations as described herein. The read level thresholds 711, 713, 715, 717, 719, 721, and 723 can be adjusted to maintain minimum BER settings throughout the life of the memory cell and track variations in programming distribution positions due to program and erase cycles, temperature, retention, or other factors.

After the cRLC operation is performed to calibrate one or more of the read level thresholds 711, 713, 715, 717, 719, 721, and 723, the DPT operation is performed to calibrate two or more PV targets corresponding to two or more of the programming distributions. After the cRLC operation and the DPT operation are performed, the second programming pass 724 can be performed. After the second programming pass, the memory cell has sixteen Vt distributions (not all individually labeled) and fifteen read level thresholds 725, 727, 729, 731, 733, 735, 737, 739, 741, 743, 745, 747, 749, 751, and 753. The second programming pass 724 uses the data stored at the memory cell that was programmed during the first programming pass 704. In another embodiment, another cRLC operation can be performed to calibrate one or more of the eight read level thresholds after the second programming pass 724, such as before a third programming pass. That is, the cRLC operation can be performed before each subsequent programming pass operation in a multi-pass programming sequence.

Figure 8:
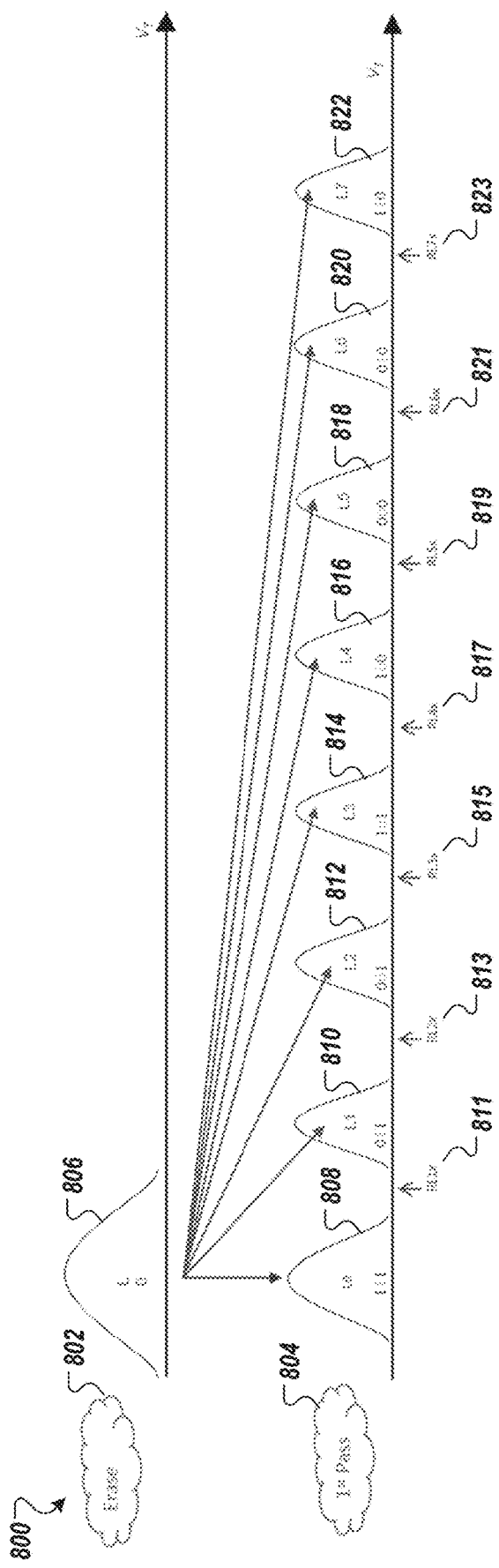
FIG. 8 illustrates a first-pass eight-level programming operation with eight Vt distributions in accordance with some embodiments of the disclosure.

FIG. 8 illustrates a first-pass eight-level programming operation 800 with eight Vt distributions in accordance with some embodiments of the disclosure. Before a first programming pass 804, a memory cell is in an erased state 802 and has a single Vt distribution 806. The first programming pass 804 programs eight levels of the memory cell, including a lower logical page, an upper logical page, and an extra logical page of a page stack. That is, after the first programming pass 804, the memory cell has eight Vt distributions 808, 810, 812, 814, 816, 818, 820, and 822 and seven read level thresholds 811, 813, 815, 817, 819, 821, and 823. Once the first programming pass 804 is performed, the cRLC operation can be performed to calibrate one or more of the read level thresholds 811, 813, 815, 817, 819, 821, and 823. After the cRLC operation is performed to calibrate one or more of the read level thresholds 811, 813, 815, 817, 819, 821, and 823, the DPT operation is performed to calibrate two or more PV targets corresponding to two or more of the programming distributions.

In one embodiment, the read level threshold 811 can be calibrated to be centered between the Vt distribution 808 and the Vt distribution 810. Similarly, the read level thresholds 813, 815, 817, 819, 821, and 823 can be centered between the respective pairs of Vt distributions 810-822. In another embodiment, any combination of the read level thresholds 811, 813, 815, 817, 819, 821, and 823 can be calibrated and the remaining one or more of the read level thresholds 811, 813, 815, 817, 819, 821, and 823, if any, can be programmed in other subsequent programming operations to spread out the calibration of the read level thresholds over time. To calibrate the read level threshold 811, the cRLC operation can iteratively perform a read operation on the memory cell and iteratively measure a BER of the memory cell. The cRLC operation can adjust the read level threshold based on the BER that centers the read level threshold between the Vt distribution 808 and Vt distribution 810. In another embodiment, to calibrate the read level threshold 811, the cRLC operation calculates a CenterBEC and a Diff-EC and uses these values to adjust the read level threshold 811. The read level thresholds 813, 815, 817, 819, 821, and 823 can be calibrated similarly in this same programming operation or in one or more subsequent operations as described herein. The read level thresholds 811, 813, 815, 817, 819, 821, and 823 can be adjusted to maintain minimum BER settings throughout the life of the memory cell and track variations in valley positions due to program/erase cycles, temperature, retention, or other factors.

After the cRLC operation and the DPT operation are performed to calibrate one or more of the read level thresholds 811, 813, 815, 817, 819, 821, and 823, a subsequent programming pass can be performed (not illustrated in FIG. 8). The read level thresholds 811, 813, 815, 817, 819, 821, and 823 can have corresponding trim values for the first programming pass 804 and these values can be adjusted to achieve a specified BER setting for the respective trim. These trim values can be separate values from those used for a subsequent programming pass.

In one embodiment, the cRLC operation described with respect to FIG. 8 can be used in a memory system with MLCs. Alternatively, the cRLC operation can be used in a memory system with other memory types where multi-pass programming operations are performed.

Figure 9:
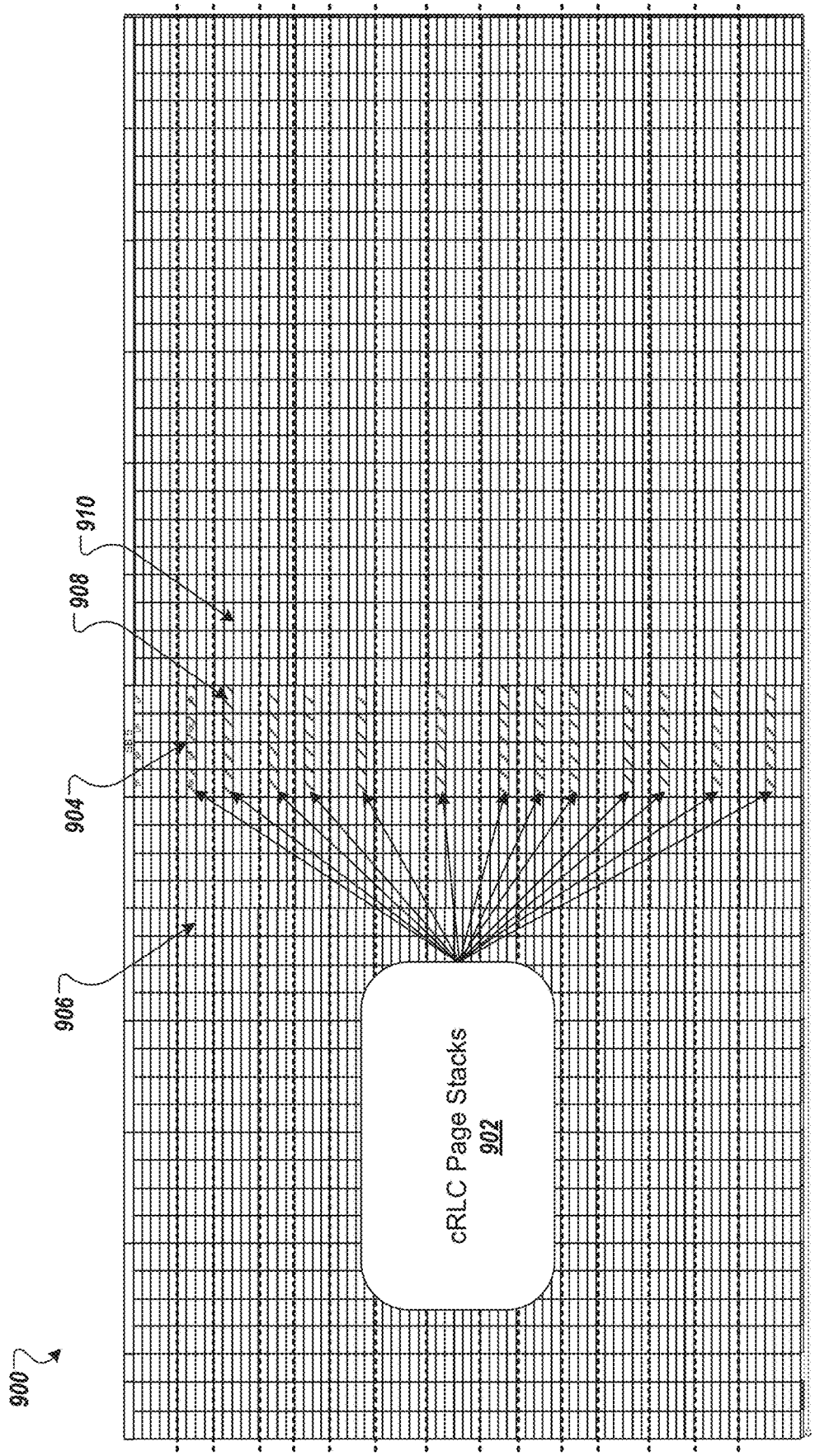
FIG. 9 is a page map of a memory block for a full block program operation with multiple cRLC page stacks in accordance with some embodiments of the disclosure.

FIG. 9 is a page map 900 of a memory block for a full block program operation with multiple cRLC page stacks in accordance with some embodiments of the disclosure. The page map 900 is a programming operation page map for a memory component having 38 wordlines (WL) per block and 9 wordline groups (WLGs) per block. The page map 900 can include sixteen sub-blocks in each block, where each sub-block of each WLG contains just one page type (e.g., LP, UP, XP, TP). The memory block can include SLC pages in the first and last WLGs, MLC pages in the second and second-to-last WLGs, and TLC pages in the intervening WLGs. Each read trim can be an N-bit offset register within the block. For example, an 8-bit offset register could be used where 7 bits are the magnitude and 1 bit is the sign convention. For each trim type, there can be a base trim value so that the offset trims for each page type are a +/− offset value relative to the base value. The offset value can correspond to the resolution of the trim.

During programming of the memory block selected for a cRLC operation, a block programming sequence is interrupted to perform cRLC. The programming interruption occurs at each page stack selected as one of the cRLC page stacks 902. The program interruption occurs just before a subsequent programming pass when the programming distributions from a previous programming operation have fully aggressed floating gate coupling from their neighbors. During block programming, each of the cRLC page stacks 902 in each of the wordline groups is interrupted and a cRLC is performed until all valleys of the page stack are centered with minimum error rate. For example, during block programming the selected block, a first sample cRLC page stack 904 in a first wordline group 906 is interrupted and a cRLC operation is performed until all valleys (read level thresholds) of the first sample cRLC page stack 904 are centered with minimum error rate. Similarly, during block programming the selected block, a second cRLC page stack 908 in a second wordline group 910 is interrupted and a cRLC operation is performed until all valleys (read level thresholds) of the second sample cRLC page stack 908 are centered with minimum error rate. In one embodiment, the full cRLC operation is run until all trims within the first sample cRLC page stack 908 are confirmed to be at their minimum BER settings. Similarly, for the second sample cRLC page stack 908, the full cRLC operation is run until all trims are confirmed to be at their minimum BER settings. In another embodiment, the cRLC sampling and convergence to minimum BER settings is spread out over many programming operations. For example only one trim within the first sample cRLC page stack 904 gets one cRLC sample on a given block programming. The next block to be programmed would get the next cRLC sample for that trim and so on until enough blocks are programmed that all trims are converged to their minimum BER settings.

It should be noted that when used with the DPT operation, the cRLC information from each valley is passed to the DPT operation for determining PV target modifications. The cRLC information can include CenterBEC, Diff-EC, other metrics, or the like.

Figure 10:
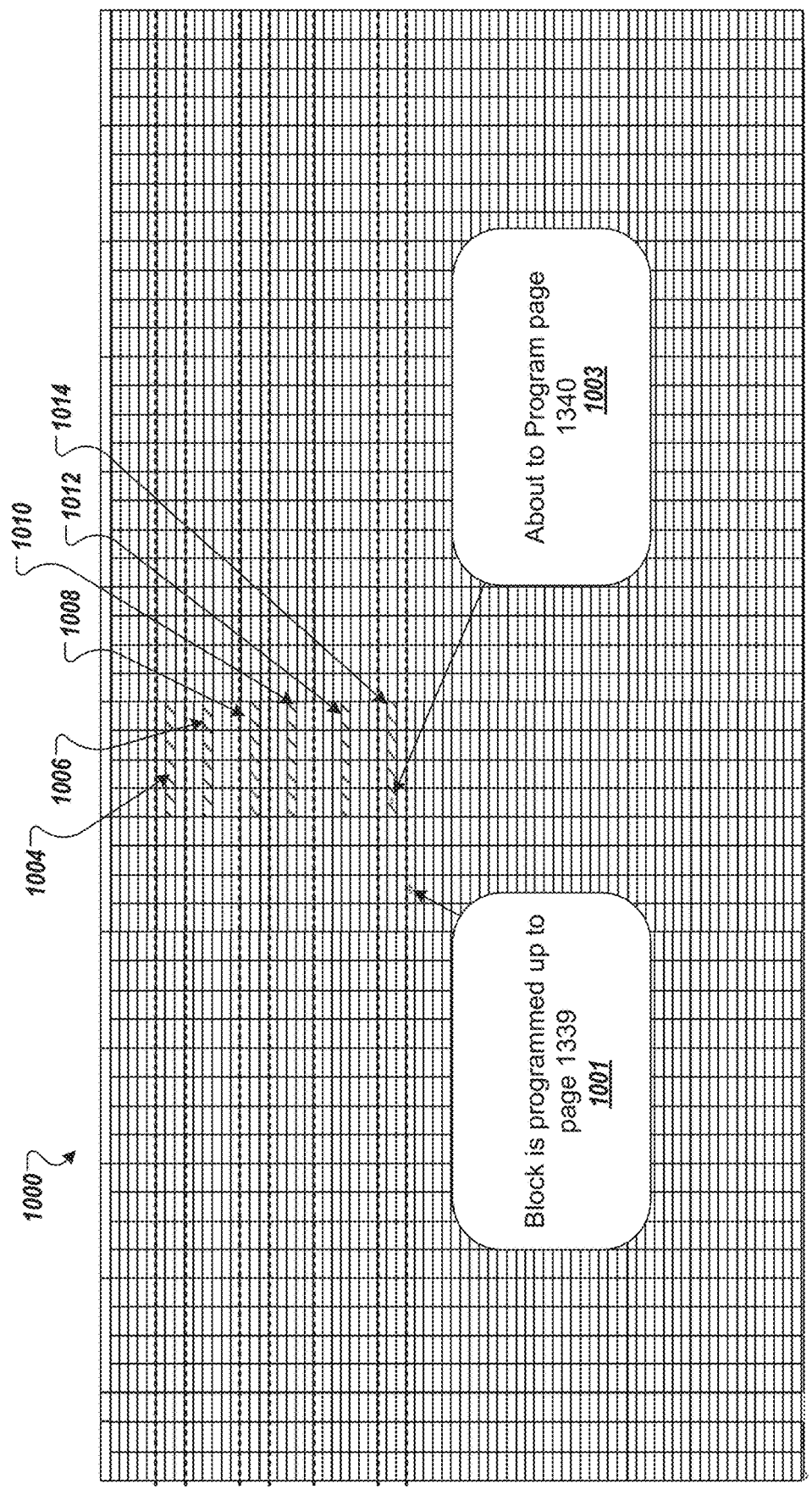
FIG. 10 is a page map of a memory block for a partial block program operation in accordance with some embodiments of the disclosure.

FIG. 10 is a page map 1000 of a memory block for a partial block program operation in accordance with some embodiments of the disclosure. During programming of the memory block selected for a cRLC operation, a block programming sequence of the block is programmed up to a specified page 1001, such as logical page 1339 as illustrated in FIG. 10. The block programming sequence is interrupted just before programming a next logical page 1003 of the corresponding logical page, such as the Top Logical Page 1340 as illustrated in FIG. 10. At this point, and at each of the other cRLC page stacks 1004-1014, the cRLC operation is allowed to fully converge the read level thresholds to become "centered" before the programming sequence is resumed. As described herein, the cRLC information can be passed on to DPT to perform its rule based modification of the associated PV trims for the next programming operation.

Figure 11:
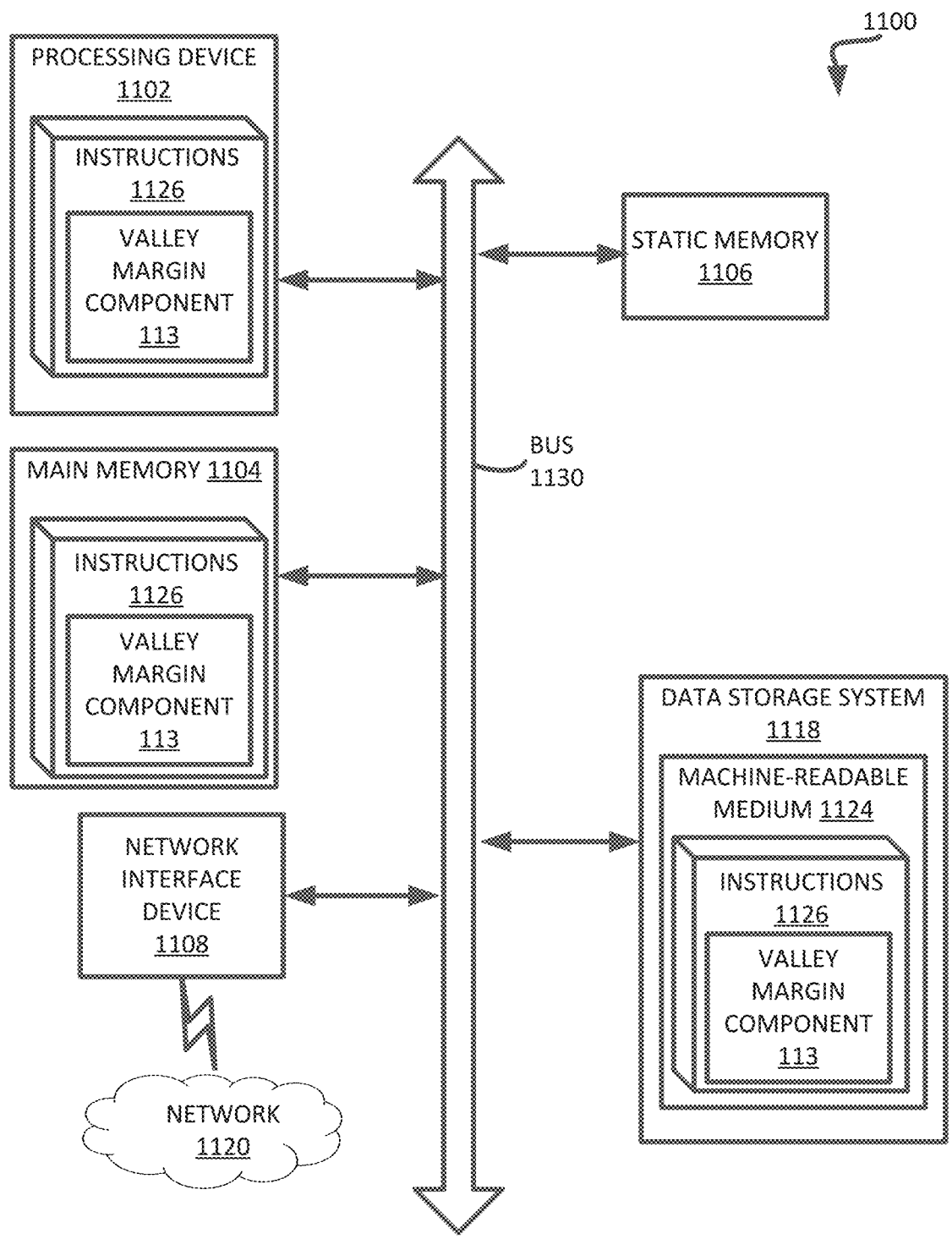
FIG. 11 illustrates an example machine of a computer system within which a set of instructions, for causing the machine to perform any one or more of the methodologies discussed herein, can be executed.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the valley margin component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1126 for performing the operations and steps discussed herein. The computer system 1100 can further include a network interface device 1108 to communicate over the network 1120.

The data storage system 1118 can include a machine-readable storage medium 1124 (also known as a non-transitory computer-readable storage medium) on which is stored one or more sets of instructions 1126 or software embodying any one or more of the methodologies or functions described herein. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

In one embodiment, the instructions 1126 include instructions to implement functionality corresponding to the valley margin component 113 of FIG. 1. While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory component; and
a processing device, operatively coupled with the memory component, to:
determine a plurality of difference error counts for a difference error that is indicative of a margin for a valley that is located between programming distributions of a memory cell of the memory component;
scale each of the plurality of difference error counts by a respective scale factor of a plurality of scale factors; and
adjust valley margins of the memory cell in accordance with the plurality of scaled difference error counts.

2. The system of claim 1, wherein to adjust the valley margins of the memory cell in accordance with the plurality of scaled difference error counts, the processing device is to:
perform a dynamic program targeting (DPT) operation on the memory cell to calibrate one or more program-verify (PV) targets associated with the programming distributions based on the scaled difference error counts.

3. The system of claim 2, wherein the DPT operation converges respective scaled difference error counts of the plurality of scaled difference error counts for a particular logical page type of the memory cell to a convergence value.

4. The system of claim 2, wherein to perform a dynamic program targeting (DPT) operation on the memory cell to calibrate the one or more PV targets associated with the programming distributions, the processing device is to:
 determine a first adjustment amount of a first PV target and a second adjustment amount of a second PV target that converges at least two of the scaled difference error counts to a convergence value;
 adjust the first PV target by the first adjustment amount; and
 adjust the second PV target by the second adjustment amount.

5. The system of claim 2, wherein to calibrate the one or more PV targets associated with the programming distributions, the processing device is to:
 determine a net-zero adjustment to at least two of the PV targets associated with the programming distributions based on the at least two of the scaled difference error counts; and
 adjust the at least two PV targets according to the net-zero adjustment.

6. The system of claim 1, wherein the difference error is inversely proportional to the valley margins.

7. The system of claim 1, wherein to determine the plurality of difference error counts for the difference error, for each of the plurality of difference error counts the processing device to:
 perform a continuous read level calibration (cRLC) operation on the memory cell to calibrate read level thresholds between the programming distributions.

8. The system of claim 7, wherein to perform the cRLC operation on the memory cell to calibrate the read level thresholds between the programming distributions, the processing device is to:
 adjust the read level thresholds to a center value that results in a lowest bit error rate.

9. The system of claim 8, wherein to perform a continuous read level calibration (cRLC) operation on the memory cell to calibrate read level thresholds between the programming distributions, the processing device is further to:
 sample the center value, a positive offset value, and a negative offset value between the programming distributions of the memory cell, wherein a difference error count of the plurality of difference error counts is determined using the center value, the positive offset value, and the negative offset value.

10. The system of claim 9, wherein for a particular logical page type the respective positive offset values and negative offset values are of an equal magnitude.

11. The system of claim 9, wherein to perform a continuous read level calibration (cRLC) operation on the memory cell to calibrate read level thresholds between the programming distributions, the processing device is further to:
 calculate a mean of the positive offset value and the negative offset value less the center value to determine each of the plurality of difference error counts.

12. The system of claim 1, wherein the valley margins of the memory cell are adjusted dynamically during operation of the memory component.

13. The system of claim 1, wherein the memory component comprises a block, the block comprising a plurality of memory cells organized in a plurality of wordline groups, wherein valley margins of a first wordline group of the plurality of wordline groups are adjusted independently from valley margins of a second wordline group of the plurality of wordline groups.

14. A method comprising:
 determining a plurality of difference error counts for a difference error that is indicative of a margin for a valley that is located between programming distributions of a memory cell of a memory component;
 scaling each of the plurality of difference error counts by a respective scale factor of a plurality of scale factors; and
 adjusting, by a processing device, valley margins of the memory cell in accordance with the plurality of scaled difference error counts.

15. The method of claim 14, wherein adjusting the valley margins of the memory cell in accordance with the plurality of scaled difference error counts, the method further comprising:
 performing a dynamic program targeting (DPT) operation on the memory cell to calibrate one or more program-verify (PV) targets associated with the programming distributions based on the scaled difference error counts.

16. The method of claim 15, wherein the DPT operation converges respective scaled difference error counts of the plurality of scaled difference error counts for a particular logical page type of the memory cell to a convergence value.

17. The method of claim 14, wherein determining the plurality of difference error counts for the difference error, for each of the plurality of difference error counts the method comprising:
 performing a continuous read level calibration (cRLC) operation on the memory cell to calibrate read level thresholds between the programming distributions so that the read level thresholds are adjusted to a center value that results in a lowest bit error rate.

18. A non-transitory computer-readable medium comprising instructions that, when executed by a processing device, cause the processing device to:
 determine a plurality of difference error counts for a difference error that is indicative of a margin for a valley that is located between programming distributions of a memory cell of a memory component;
 scale each of the plurality of difference error counts by a respective scale factor of a plurality of scale factors; and
 adjust, by the processing device, valley margins of the memory cell in accordance with the plurality of scaled difference error counts.

19. The non-transitory computer-readable medium of claim 18, wherein to adjust the valley margins of the memory cell in accordance with the plurality of scaled difference error counts, the processing device to:
 perform a dynamic program targeting (DPT) operation on the memory cell to calibrate one or more program-verify (PV) targets associated with the programming distributions based on the scaled difference error counts, wherein the DPT operation converges respective scaled difference error counts of the plurality of scaled difference error counts for a particular logical page type of the memory cell to a convergence value.

20. The non-transitory computer-readable medium of claim 18, wherein to determine the plurality of difference error counts for the difference error, for each of the plurality of difference error counts, the processing device to:
 perform a continuous read level calibration (cRLC) operation on the memory cell to calibrate read level thresholds between the programming distributions so that the read level thresholds are adjusted to a center value that results in a lowest bit error rate.

* * * * *

UNITED STATES PATENT AND TRADEMARK OFFICE
CERTIFICATE OF CORRECTION

PATENT NO. : 10,748,625 B1
APPLICATION NO. : 16/295857
DATED : August 18, 2020
INVENTOR(S) : Michael Sheperek, Larry J. Koudele and Bruce A. Liikanen It is certified that error appears in the above-identified patent and that said Letters Patent is hereby corrected as shown below:

On the Title Page

Item (54) and in the Specification Column 1 Line 1 delete "PROGRAMING" and insert
--PROGRAMMING--

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*